United States Patent
Omae

(10) Patent No.: US 6,853,396 B1
(45) Date of Patent: Feb. 8, 2005

(54) DRIVING IC AND OPTICAL PRINT HEAD

(75) Inventor: Mitsuhiro Omae, Tottori (JP)

(73) Assignees: Sanyo Electric Co., Ltd., Osaka (JP);
Tottori Sanyo Electric Co., Ltd.,
Tottori (JP)

(*) Notice: Subject to any disclaimer, the term of this patent is extended or adjusted under 35 U.S.C. 154(b) by 54 days.

(21) Appl. No.: 10/088,266
(22) PCT Filed: Sep. 14, 2000
(86) PCT No.: PCT/JP00/06333
§ 371 (c)(1),
(2), (4) Date: Mar. 18, 2002
(87) PCT Pub. No.: WO01/21411
PCT Pub. Date: Mar. 29, 2001

(30) Foreign Application Priority Data

Sep. 20, 1999 (JP) ............................. 11/265904

(51) Int. Cl.[7] ............................. B41J 2/447; B41J 2/45
(52) U.S. Cl. ...................................................... 347/237
(58) Field of Search ................................ 347/237, 247, 347/211, 180, 181, 182

(56) References Cited

U.S. PATENT DOCUMENTS 5,307,089 A    4/1994   Takasu et al.

FOREIGN PATENT DOCUMENTS

| EP | 0 744 298 A2 | 5/1996 |
|---|---|---|
| JP | S61-228973 | 10/1986 |
| JP | 62-152873 A1 | 4/1987 |
| JP | 04-255368 | 9/1992 |
| JP | H06-091933 | 4/1994 |
| JP | 08-187889 A1 | 7/1996 |
| JP | 10-181079 A1 | 7/1998 |
| JP | 10-202947 A1 | 8/1998 |
| JP | 10-202947 | 8/1998 |
| JP | 10-226102 A1 | 8/1998 |
| JP | 10-235935 | 9/1998 |
| JP | 2001-88345 | 4/2001 |
| WO | WO 01/21411 | 3/2001 |

OTHER PUBLICATIONS

Supplementary Partial European Search Report dated Oct. 2, 2002.
Supplementary European Search Report dated Feb. 7, 2003.
International Search Report PCT/JP00/06333.

Primary Examiner—Huan Tran
(74) Attorney, Agent, or Firm—McDermott Will & Emery LLP

(57) ABSTRACT

An optical print head has a light-emitting device 22 having n individual electrodes 28, p common electrodes 27, and a plurality of (n×p) light-emitting parts 26 selected by those individual and common electrodes and a driving IC 1 having individual electrodes and m group-selecting terminals CD1 to CD40. A plurality of (q) light-emitting devices 22 are provided for one driving IC 1, and the number (q) of light-emitting devices 22 is determined by the number (p) of common electrodes 27 provided on each light-emitting device 22 and the number (m) of the group-selecting terminals CD provided on the driving IC 1.

32 Claims, 21 Drawing Sheets

DRIVING IC AND OPTICAL PRINT HEAD

TECHNICAL FIELD

The present invention relates to an optical print head for use as a recording head in a printer or the like. More particularly, the present invention relates to a novel driving IC for driving a light-emitting device designed to be ready for time-division driving within the device, and to an optical print head employing such a driving IC.

BACKGROUND ART

As is disclosed in Japanese Utility Model Laid-Open No. H6-48887, in a conventional optical print head, a light-emitting device (array) has a plurality of individual electrodes provided on the front surface of the device so as to correspond one to one to a plurality of light-emitting parts formed on the device, and has a single electrode provided on the back surface of the device so as to be common to all of those light-emitting parts. This makes it impossible to perform time-division driving within a single device. Since it is impossible to perform time-division driving, it is necessary to provide as many individual electrodes as light-emitting parts. Thus, as the light-emitting parts are formed at higher and higher density, the individual electrodes need to be formed at accordingly high density, making their connection to a driving IC difficult.

To solve this problem, Japanese Patent Application Laid-Open No. H6-163980 proposes a light-emitting device that permits time-division driving within the device. Specifically, a plurality of light-emitting parts arranged on the light-emitting device are divided into p, for example 2 or 3, groups, a plurality of common electrodes are provided so that each of them is connected to all the light-emitting parts of one of those groups, and n individual electrodes are provided so that each of them is connected to p light-emitting parts belonging to different groups. Thus, the light-emitting device proposed here is provided with p×n light-emitting parts in total. In this light-emitting device, by selecting one of the p common electrodes on a time-division basis, it is possible to reduce the number of individual electrodes needed to 1/p the number needed conventionally, and thereby make their connection to a driving IC easier.

This light-emitting device can be driven on a time-division basis by using a driving IC as used conventionally. In this case, however, a separate driving circuit is additionally necessary to select one of the common electrodes on a time-division basis. To avoid this, there has been demand for the development of a versatile driving IC suitable for time-division driving.

Under these circumstances, the applicant of the present invention once proposed a driving IC in Japanese Patent Application Laid-Open No. H10-226102, with consideration given to the aforementioned points. However, with the configuration proposed here, it is necessary to change the order of data input to achieve time-division driving, which involves complicated processing of data. Moreover, it is necessary to use as many driving ICs as light-emitting elements used; that is, it is necessary to use many driving ICs at accordingly high cost. Furthermore, this driving IC, when applied to light-emitting devices having different resolutions, requires complicated processing of data.

DISCLOSURE OF THE INVENTION

An object of the present invention is to provide a versatile driving IC suitable to drive a light-emitting device designed to be ready for time-division driving. Another object of the present invention is to provide a driving IC that works with a plurality of types of light-emitting device having different resolutions. Still another object of the present invention is to provide a driving IC that permits fast data input.

To achieve the above objects, according to one aspect of the present invention, an optical print head is provided with: a light-emitting device comprising n×p light-emitting parts, n first electrodes each connected to one terminal of p of the light-emitting parts, and p second electrodes each connected to the other terminal of n of the light-emitting parts, wherein selection among the light-emitting parts is achieved by selecting one among the first electrodes and one among the second electrodes; and a driving IC device comprising n first output terminals connected individually to the first electrodes of the light-emitting parts and m second output terminals connected individually to the second electrodes of the light-emitting parts. Here, in total, q light-emitting devices are provided for one driving IC device, and the number q of light-emitting devices is determined by the number p of second electrodes provided on each light-emitting device and the number m of second output terminals provided on each driving IC device.

According to another aspect of the present invention, a driving IC device for supplying a driving current to a light-emitting device having a plurality of light-emitting parts arranged in a row is provided with n first output terminals each connected to one terminal of m light-emitting parts and a first drive section connected to the first output terminals. Here, the first drive section is provided with: a data signal storage circuit for storing at least n×m data signals fed in sequentially via r input terminals; a data selecting circuit for selecting and extracting, in groups of n, the data signals stored in the data signal storage circuit; and a drive circuit for outputting drive signals individually to the first output terminals on the basis of the data signals selected by the data selecting circuit.

According to still another aspect of the present invention, an optical print head is provided with a light-emitting device having a plurality of light-emitting parts and a driving IC device for supplying a driving current to the light-emitting parts of the light-emitting device. Here, the light-emitting device is provided with n first electrodes each connected to one terminal of a plurality of light-emitting parts. Moreover, the driving IC device is provided with n first output terminals connected individually to the first electrodes of the light-emitting device and a first drive section for outputting the driving current via the first output terminals. Furthermore, the first drive section is provided with a data signal storage circuit for storing at least n×m data signals fed in sequentially via r input terminals, a data selecting circuit for selecting and extracting, in groups of n, the data signals stored in the data signal storage circuit, and a drive circuit for outputting drive signals individually to the first output terminals on the basis of the data signals selected by the data selecting circuit.

BEST MODE FOR CARRYING OUT THE INVENTION

Hereinafter, embodiments of the present invention will be described with reference to the drawings.

First Embodiment

Figure 1:
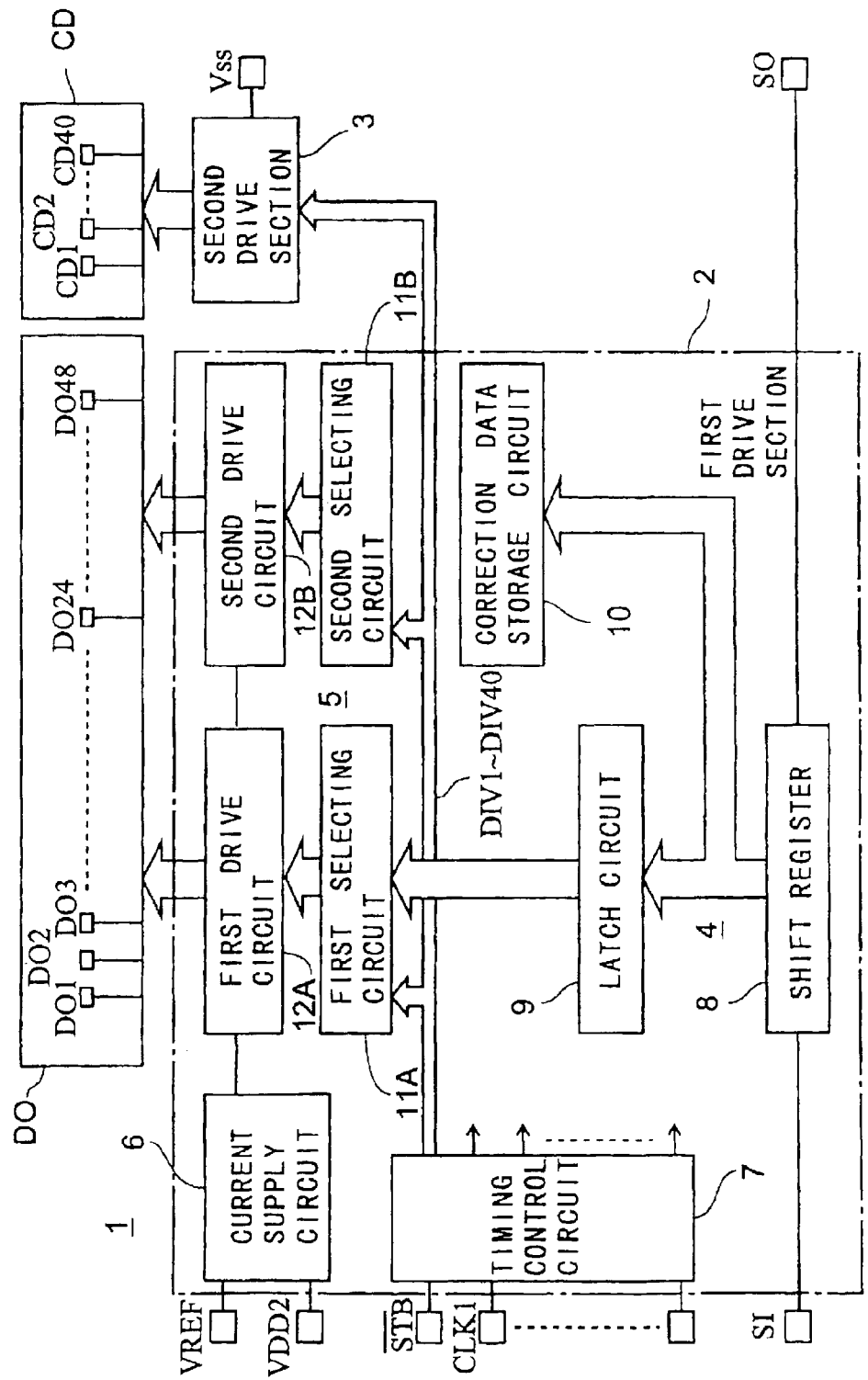
FIG. 1 is a circuit block diagram of the driving IC of a first and a second embodiment of the invention.
Figure 2:
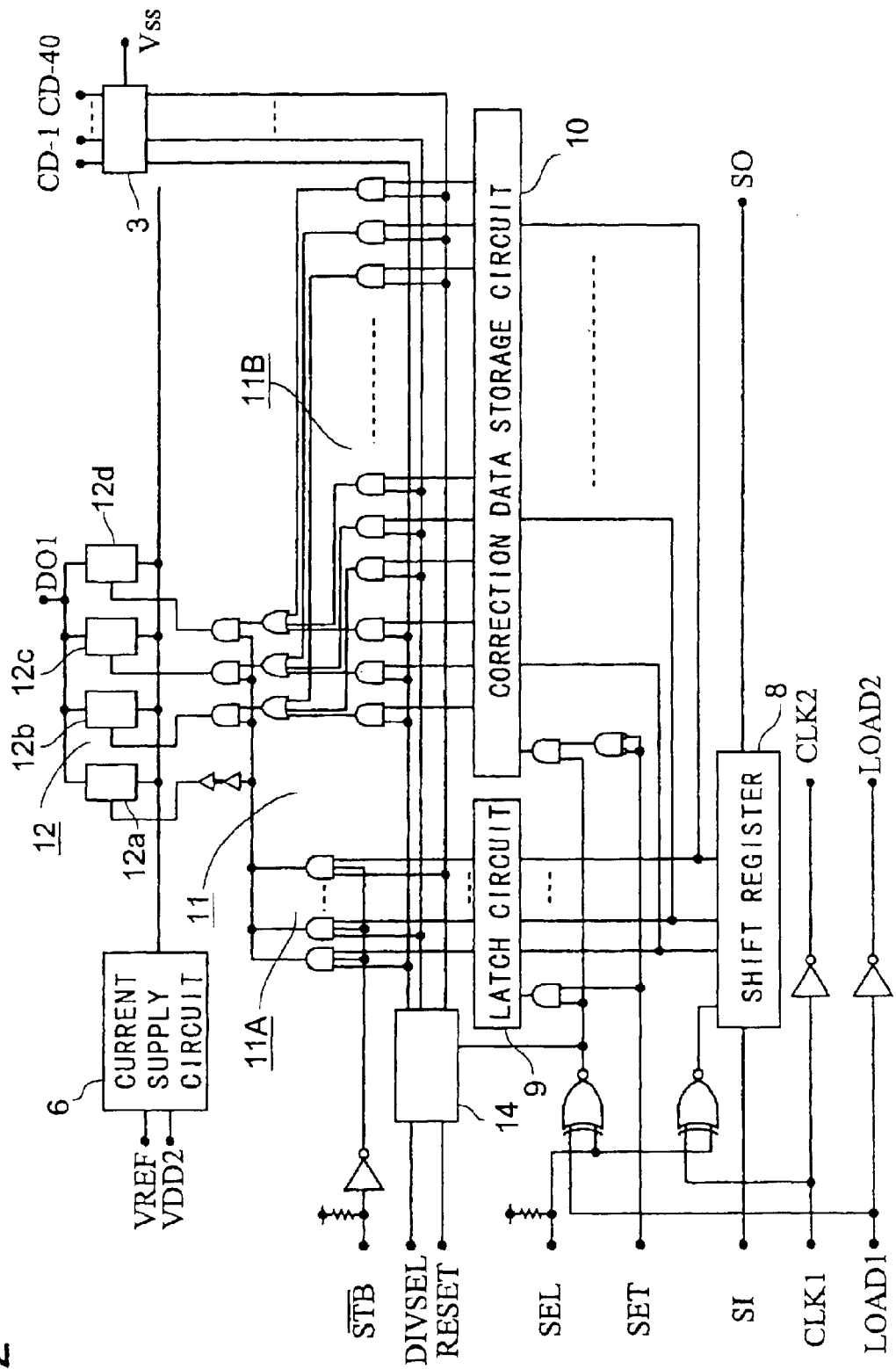
FIG. 2 is a circuit block diagram of a principal portion of the first and second embodiments.

FIG. 1 is a circuit block diagram showing the basic configuration of the driving IC of a first and a second embodiment of the invention. FIG. 2 is a circuit block diagram of a principal portion of the circuit block diagram of FIG. 1, specifically the portion associated with one DO1 among a plurality of output terminals DO1 to DO48. First, descriptions will be given with reference mainly to these figures.

As shown in FIG. 1, the driving IC 1 is provided with an individual terminal section DO consisting of a plurality of (n) output terminals DO1 to DO48 for driving light-emitting devices (i.e. to be connected to the individual electrodes 28 described later), a first drive section 2 connected to the output terminals DO1 to DO48 to feed predetermined current outputs as driving signals to them, a common terminal section CD consisting of a plurality of (m) output terminals CD1 to CD40 for selecting groups (i.e. to be connected to the common electrodes 27 described later), and a second drive section 3 connected to the output terminals CD1 to CD40 to selectively switch them to one of the supplied-power potentials, for example the ground potential VSS. The following descriptions deal with a case where n=48 and m=40 as shown in the figures. However, it is to be understood that the present invention may be implemented in any other manner than specifically described below.

The first drive section 2 is provided with a data signal storage circuit 4 for temporarily storing serial input data signals that are fed in sequentially via a data input terminal SI, a drive circuit 5 for outputting drive signals individually to the output terminals DO1 to DO48 on the basis of the data signals output from the data signal storage circuit 4, a current supply circuit 6 for supplying a constant current to the drive circuit 5, and a timing control circuit 7 for feeding predetermined timing signals to relevant portions of the first and second drive sections 2 and 3.

The data signal storage circuit 4 is provided with a shift register 8 of an n×m (1,920) bit type that takes in serially the data signals fed in sequentially via the data input terminal SI in synchronism with a clock signal CLKI and that outputs the data signals serially via a data output terminal SO, and a latch circuit 9 of an n×m (1,920) bit type that takes in parallel the data signals taken in by the shift register 8 on the basis of a load signal LOAD 1. The n×m (1,920) data signals output parallel from the shift register 8 can be fed also to a storage circuit 10 without being passed through the latch circuit 9.

In cases where, for example, the data signals are each consisting of a plurality of bits, the shift register 8 and the latch circuit 9 may be configured differently to suit the particular cases. For example, the shift register 8 may be configured as a memory of which different portions are specified by addresses.

The drive circuit 5 is provided with, as its main blocks, a first selecting circuit 11A that sequentially selects and outputs, in groups of n, the n×m (1,920) data signals output from the latch circuit 9, and a first drive circuit 12A of an n (48) bit type that outputs a predetermined current via the output terminals DO1 to DO48 on the basis of the output of the first selecting circuit 11A. As required, in addition to these main blocks, the drive circuit 5 is further provided with a correction data storage circuit 10 for storing n×m (1,920) correction data signals with which to correct the output current (the amount of light), a second selecting circuit 11B, for correction data, that sequentially selects and outputs, in groups of n, the n×m (1,920) correction data signals output from the correction data storage circuit 10, and a second drive circuit 12B, for correction data, that outputs, as driving signals via the output terminals DO1 to DO48, current outputs of which the current is adjusted on the basis of the output from the second selecting circuit 11B.

The storage circuit 10 is configured as, for example, a latch circuit of an S×n×m bit type so that it can store n×m (1,920) correction data signals each consisting of a plurality of (S) bits (for example, 3 bits). The writing of correction data signals to the correction data storage circuit 10 is achieved on the basis of the signals fed parallel, in groups of n×m, from the shift register 8.

The writing of correction data signals to the correction data storage circuit 10 can be performed in advance. Specifically, it can be achieved, with the storage circuit 10 alone brought into a write enable state, by writing one bit of each correction data signal thereto through the shift register 8 and repeating this operation S (3) times.

As shown in FIG. 2, the drive circuit 12 is provided with, for each output terminal (for example DO1), a set of a plurality of (in this example, four) current amplifiers 12a to 12d that output different current outputs; that is, the drive circuit 12 is provided with as many (in this example, 48) sets of such current amplifiers as the output terminals arranged in the individual terminal section DO. The four current amplifiers 12a to 12d of each set are fed with a current from the current supply circuit 6, and their operation is controlled individually so that they together yield a total current around 4 mA, variable in the range from 3 to 5 mA.

The selecting circuit 11 is a circuit for selecting and extracting, in groups of n and thus sequentially at m different times, the n×m data signals or correction data signals stored in the latch circuit 9 or the correction data storage circuit 10 so as to achieve time-division driving. The selecting circuit 11 is composed of a plurality of logic gate circuits. The gates constituting the selecting circuit 11 are opened and closed by a division timing signal generator circuit 14 included in the timing control circuit 7.

Figure 3:
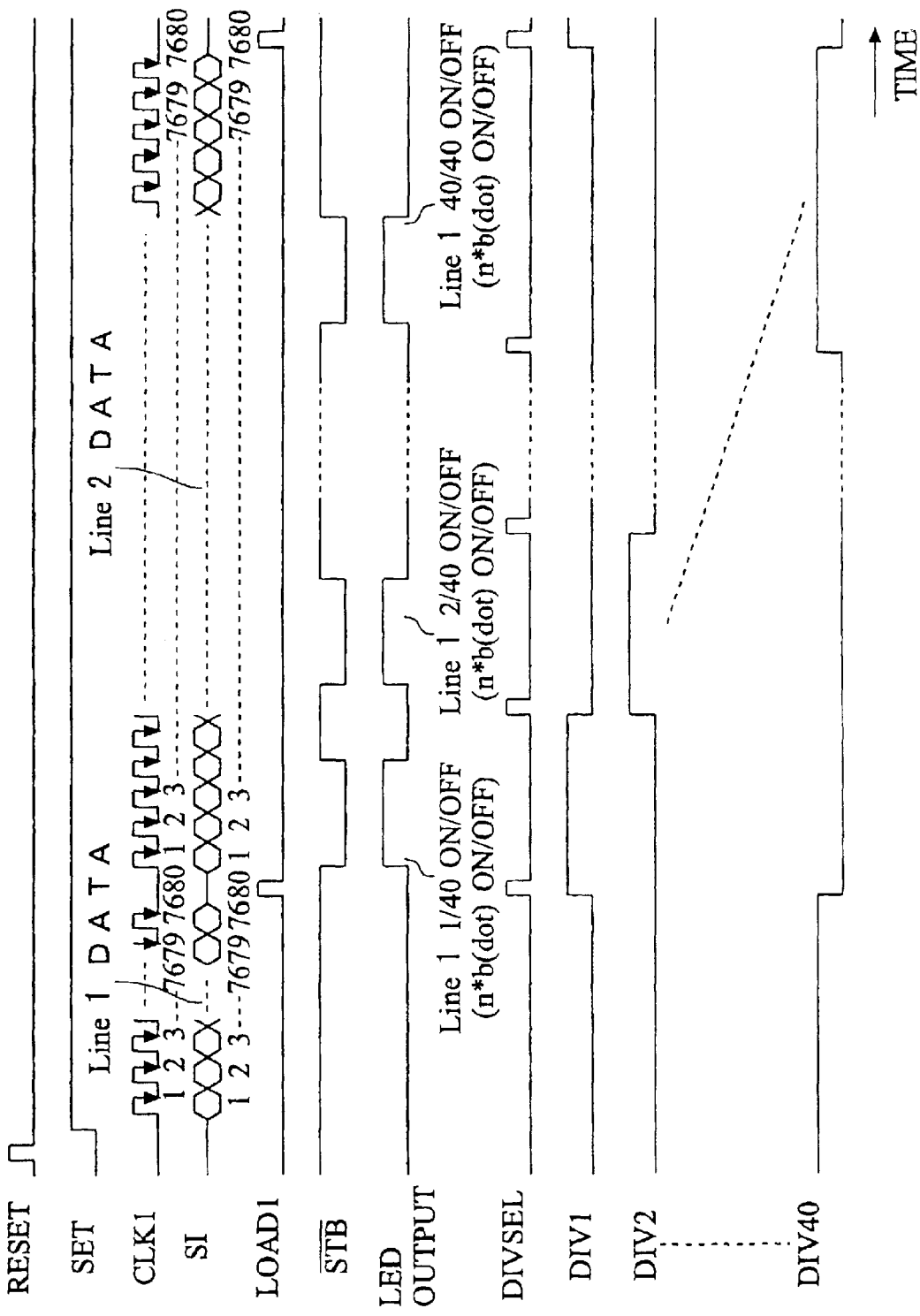
FIG. 3 is a timing chart of the first and second embodiments.

FIG. 3 shows the waveforms relevant to the division timing signal generator circuit 14.

As shown in this figure, the division timing signal generator circuit 14 is a circuit for producing m division timing signals DIV1 to DIV40 on the basis of a control signal DIVSEL that is supplied from outside by way of a small number of (in this example, one) signal lines to determine the timing of time division. The division timing signal generator circuit 14 is composed of, for example, counters. Instead of counters, the division timing signal generator circuit 14 may be composed of decoders or the like that produce m division timing signals DIV1 to DIV40 on the basis of a control signal DIVSEL that consists of a predetermined number of bits of binary numbers. In this way, the division timing signal generator circuit 14 produces m (40) division timing signals (DIV1 to DIV40) on the basis of one control signal DIVSEL or a small number of control signals. That is, the control signal DIVSEL is fed in by way of a smaller number of signal lines than the number of division timing signals. This makes it possible not only to reduce the number of terminals that need to be provided to receive control signals from outside and thereby miniaturize the IC, but also to reduce the number of conductors, such as wire-bonded leads, that need to be laid to achieve external connection.

The division timing signal generator circuit 14 can be reset in synchronism with the input of data signals that constitute one line. The division timing signal generator circuit 14 can be reset not only by the use of a reset signal RESET but also by the use of the load signal LOAD1 mentioned earlier.

Next, with reference to FIG. 2, the flow of data will be described with respect mainly to one output terminal DO1. As the division timing signals DIV1 to DIV40 are turned to H level one by one, 40 AND gate circuits provided in the first selecting circuit 11A and connected to those division timing signals DIV1 to DIV40 and to the latch circuit 9 are opened one by one. Thus, the data signals corresponding to the whole IC that are stored in the latch circuit 9 (1,920 pieces of on/off data) are selectively output through the AND gate circuit that is open at each moment. Similarly, as the division timing signals DIV1 to DIV40 are turned to H level one by one, AND gates circuit provided in sets of three (in this example, 40 sets in total) in the second selecting circuit 11B are opened one set after another. Thus, the three-bit correction data signals stored in the correction data storage circuit 10 are selectively output through the set of AND gate circuits that is open at each moment. The output of the correction data storage circuit 10 is fed to the drive circuit 12 so as to selectively operate, together with the data signals fed from the latch circuit 9 through the first selecting circuit 11A, the three current amplifiers 12b to 12d.

Next, the second drive section 3 will be described. The second drive section 3 is a circuit for selectively switching one of the output terminals CD1 to CD40 to the ground potential VSS. Here, the switching is achieved on the basis of the division timing signals DIV1 to DIV40. The switching may be achieved by the use of other signals that are synchronous with the division timing signals DIV1 to DIV40.

Figure 5:
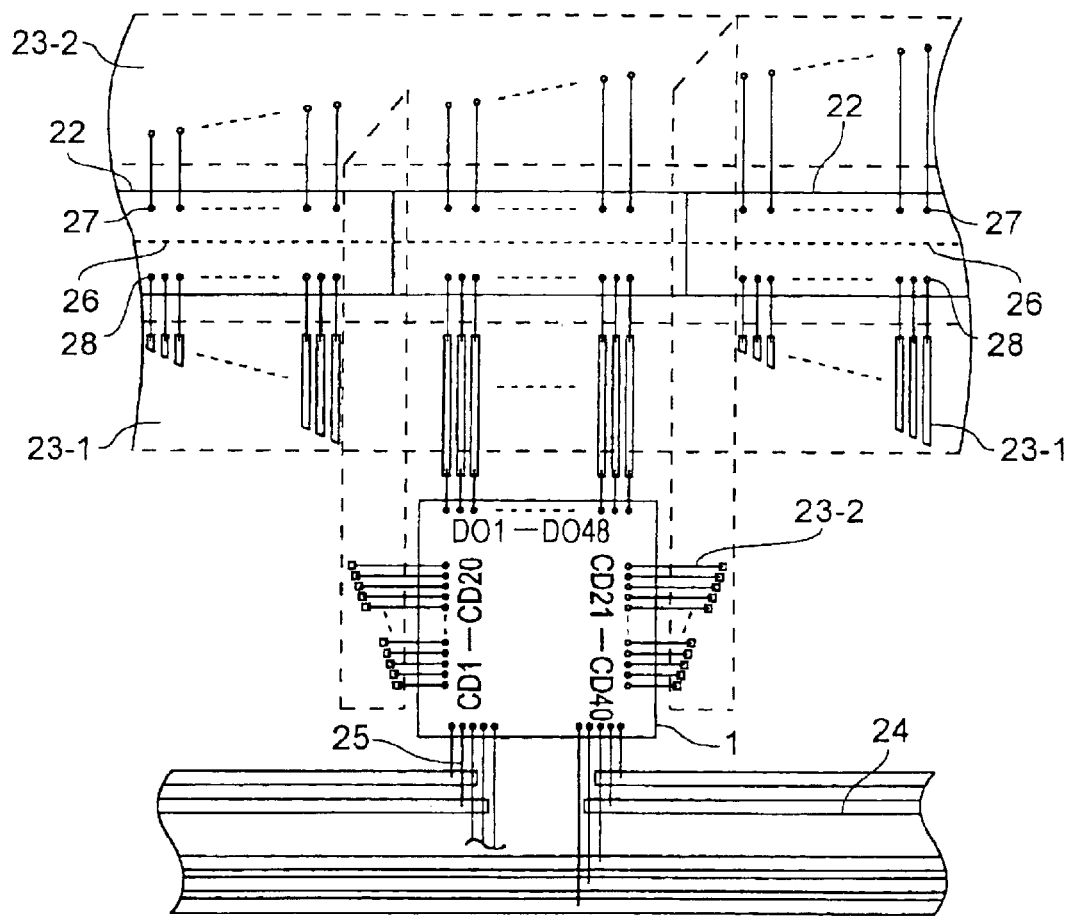
FIG. 5 is a plan view of a principal portion of the optical print head of the first embodiment.

As shown in FIG. 5, the driving IC1 has the terminals DO1 to DO48 arranged along one side, has the terminals CD1 to CD40 arranged along two opposite sides, with half of them arranged along one side, and has other terminals for data, clocks, and power supply arranged along the remaining side. That is, the driving IC 1 has terminals having similar functions arranged along each side. The terminals DO1 to DO48 are arranged at a density of about 150 DPI (dots per inch). This density is determined by the critical density of the fine conductor pattern formed on the substrate 21 described later. Specifically, on the substrate 21, a first and a second conductor pattern 23-1 and 23-2 are laid at a density of about 150 DPI, and therefore the terminals DOI to DO48 are arranged at a density substantially equal thereto.

Figure 4:
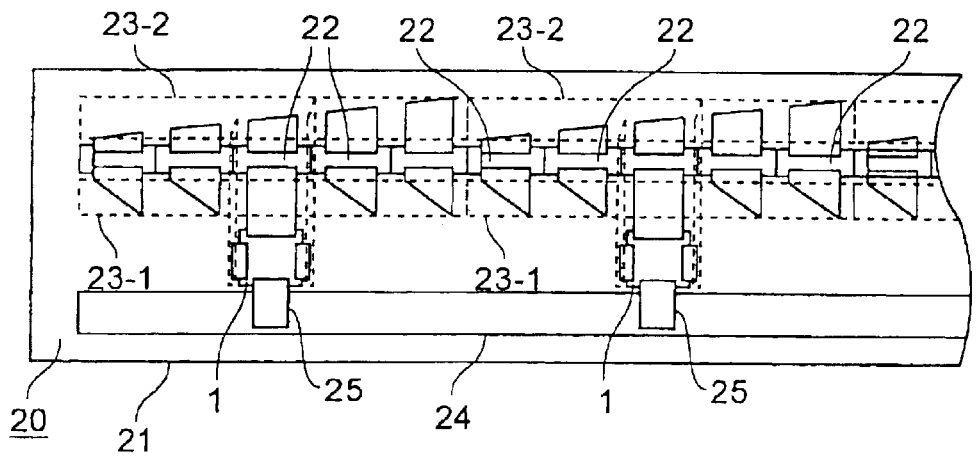
FIG. 4 is a plan view of a principal portion of the optical print head of the first embodiment.

FIG. 4 is a plan view schematically showing a principal portion of the optical print head 20 incorporating the driving IC 1 described above. This optical print head 20 has a plurality of (in this example, L=20) light-emitting devices 22 arranged in a row on an insulating substrate 21, and has a smaller number of driving ICs 1 than the light-emitting devices 22 arranged in a row on one side of the light-emitting devices 22. The driving ICs 1 are provided one for every predetermined number q of (in this example, 5) light-emitting devices 22. Thus, one driving IC 1 and q light-emitting devices 22 corresponding thereto together form one block (b). A plurality of (in this example, b=4) such blocks are arranged along the longer sides of the substrate 21, and thereby constitute the optical print head 20.

Between the light-emitting devices 22 and the driving ICs 1 are laid conductors 23 for connecting them together. The conductors 23 include first conductors 23-1 for multiplexing that are, at one end, connected to the output terminals DO1 to DO48 of the driving IC 1 of each block and that are, at the other end, connected to the individual electrodes of the light-emitting devices 22 within the same block on a common basis, and second conductors 23-2 that are, at one end, connected to the output terminals CD1 to CD40 for group selection of the driving IC 1 of each block and that are, at the other end, connected to the common electrodes of the light-emitting elements 22 within the same block on a selective basis. The first conductors 23-1 consist of a conductor pattern for multiplexing that is laid in multiple layers on the substrate 21 and wire-bonded leads that connect this pattern to the driving ICs 1 and to the light-emitting devices 22. Likewise, the second conductors 23-2 consist of a conductor pattern that is laid in multiple layers on the substrate 21 and wire-bonded leads that connect this pattern to the driving ICs 1 and to the light-emitting devices 22. The portions of the conductor patterns constituting the first and second conductors 23-1 and 23-2 which have substantially the same length as the total length along which the light-emitting devices 22 are arranged are arranged separately on both sides of the row of the light-emitting devices 22. This makes it easier to perform wire-bonding between the conductor patterns and the plurality light-emitting devices 22 as will be described later.

Of these portions of the patterns of the conductors 23 which are arranged separately on both sides of the row of the light-emitting devices 22, those belonging to the first conductors 23-2 are smaller in number than those belonging to the second conductors 23-1, but the former are larger in both pattern width and interval width than the latter. Thus, the total width of the portions belonging to the second conductors 23-2 is larger than that of the portions belonging to the first conductors 23-1. The driving ICs 1 and the light-emitting devices 22 are connected together in this way, and in addition, of the portions of the patterns of the conductors 23-1 and 23-2 which are arranged separately on both sides of the row of the light-emitting devices 22, those having a larger total width are arranged on one side and those having a smaller total width are, together with the driving ICs 1, arranged on the opposite side. Thus, the light-emitting devices 22 can be arranged near the center of the substrate 21 in the direction of the width thereof. This helps enhance the optical characteristics of the optical print head as by enhancing the linearity of the arrangement of the light-emitting devices 22 (in particular when the substrate 21 is made of glass epoxy).

The material of the substrate 21 may be, instead of glass epoxy, ceramics or insulating metal. In this example, glass epoxy is used because it makes it easy to lay conductors in multiple layers and to obtain a long substrate, and because it is inexpensive. Irrespective of whether the substrate is made of glass epoxy, ceramics, or metal, the current technology permits fine conductors to be laid at a density of about 150 DPI at best. The conductors 23 may be realized with, instead of conductors laid in multiple layers on the substrate 21 and wire-bonded leads of gold or the like, high-density flexible wires connected by the use of anisotropic conductive adhesive.

On the substrate 21, separately from the conductors 23, a plurality of conductor patterns 24 for signal transmission and power supply are laid so as to extend in the direction of arrangement of the light-emitting devices 22. These conductors include conductors by way of which adjacent driving ICs 1 are connected together so that they can exchange data signals and the like. Between the driving ICs 1 and the conductor patterns 24 are laid wire-bonded leads 25 of gold.

Each light-emitting device 22 has a plurality of (p=n=384) light-emitting parts 26 arranged on the top surface thereof, along the longer sides thereof and at a density of about 1,200 DPI. These light-emitting parts 26 are formed independently of each other so that they can be driven on a time-division basis. Specifically, the light-emitting parts 26 are divided into a plurality of (p) groups so that they can be driven in groups of n. In this example, the light-emitting parts 26 are divided into 8 groups on the basis of the remainder that remains when the number representing the order of arrangement of each light-emitting part 26 is divided by a division number p (8). Specifically, here, of all the light-emitting parts 26, the first, ninth, seventeenth, . . . belong to a first group, the second, tenth, eighteenth, . . . belong to a second group, and so forth.

Figure 6:
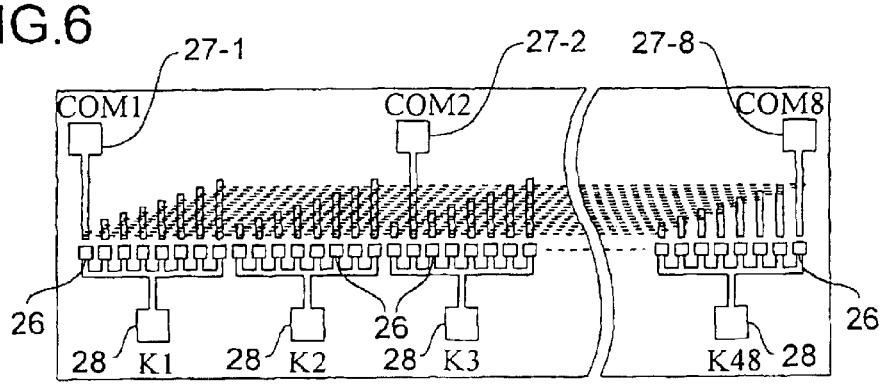
FIG. 6 is a plan view of a principal portion of the light-emitting device of the first embodiment.

Moreover, as shown in FIG. 6, on the light-emitting device 22 are laid eight common electrodes 27, consisting of a common electrode 27-1 that is connected to the light-emitting parts 26 belonging to the first group on a common basis, a common electrode 27-2 that is connected to the light-emitting parts 26 belonging to the second group on a common basis, . . . , and a common electrode 27-8. Also laid are n (48) individual electrodes 28 of which each is connected to eight consecutive light-emitting parts 26. Whereas the common electrodes 27 are arranged at a density of about 25 DPI, which is lower than the maximum conductor density (150 DPI) on the substrate 21, the individual electrodes 28 are arranged at a density of about 150 DPI, i.e. at a density substantially equal to the maximum conductor density (150 DPI) on the substrate 21. To reduce the number of conductor layers laid on the surface of the light-emitting device 22, the common electrodes 27 and the individual electrodes 28 are arranged on opposite sides of the light-emitting parts 26 and along the longer sides of the light-emitting device 22.

This light-emitting device 22 is so configured that the light-emitting parts 26, composed of LEDs, are located at the intersections of matrix-like conductors of which some are connected to the p (8) common electrodes 27 and the others are connected to n (48) individual electrodes 28. Thus, by feeding data signals to the n individual electrodes 28 and selecting one among the common electrodes 27, it is possible to drive n light-emitting parts 26 simultaneously and, by repeating this p times, it is possible to drive the whole light-emitting device 22.

The individual electrodes 28 are connected individually through the first conductors 23-1 to the output terminals DO1 to DO48 of the corresponding driving IC 1, and the common electrodes 27 are connected selectively through the second conductors 23-2 to eight among the output terminals CD1 to CD40 of the same driving IC 1.

Figure 7:
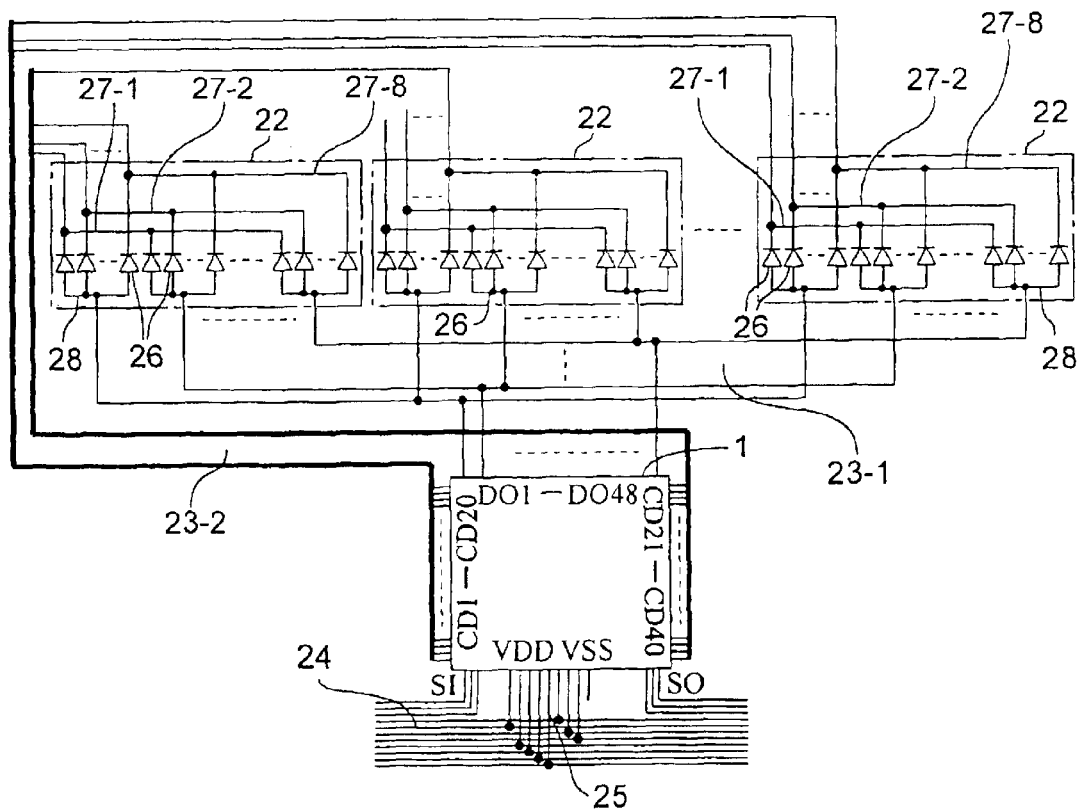
FIG. 7 is a circuit block diagram of the optical print head of the first and second embodiments.

As shown in FIG. 7, within a block formed by one driving IC 1 and q (in this example, light-emitting devices 22 corresponding thereto, the output terminals DO1 to DO48 of the driving IC 1 are connected through the first conductors 23-1 to the individual electrodes 28 of the q light-emitting devices 22 on a common basis. The output terminals CD1 to CD40 of the driving IC 1 are connected through the second conductors 23-2 to the individual electrodes 27 of the q (5) light-emitting devices 22 on an individual basis.

When one among the group-selecting terminals CD1 to CD40 of the driving IC 1 is selected and predetermined signals are fed to the terminals DO1 to DO48, one among the q light-emitting devices 22 is selected, and its light-emitting parts 26 are lit on a time-division basis, one eighth of them at a time. Thus, by repeating this 40 times to select all of the group-selecting terminals, it is possible to selectively light all of the light-emitting parts 26 within the block.

In this example, q (5) light-emitting devices 22 are provided in one block, and there are four such blocks. Thus, in the entire head 20 are provided b×q×p×n=4×5×8×48 =7,680 light-emitting parts 26 in total.

Next, the operation of the optical print head 20 described above, including the operation of the driving IC 1 of the first embodiment, will be described with reference to, in addition to FIGS. 1 and 2, the timing chart shown in FIG. 3.

Here, it is assumed that, for the purpose of making the amount of light emitted by the individual light-emitting parts 26 of the light-emitting devices 22 even, correction data with which to correct the amount of light they emit has been determined in advance and already stored in the storage circuit 10.

First, a reset signal RESET is fed in, which initializes the entire optical print head. Then, a set signal SET is turned from L level to H level. As a result, the correction data storage circuit 10 is brought into a write disable state.

Data signals (7,680 signals) corresponding to one line are sequentially fed to the data input terminal SI of the driving IC 1 located at one end, and are taken in by the shift register 8 of this driving IC 1 in synchronism with the clock signal CLK1. When a predetermined number of data signals have been taken in, the data signals are fed through the data output terminal SO to the shift register 8 of the next IC cascaded to the first IC.

When the data signals corresponding to one line have been taken in and thus data signals are stored in the shift registers 8 of all the driving ICs 1, then the load signal LOAD 1 is held at H level for a predetermined period so that the n×m data signals held in the shift register 8 of each driving IC 1 are input. Here, the latch circuit 9 selects (latches) data signals on a trailing edge of the load signal LOAD 1, and therefore the n×m data signals taken in by the shift register 8 are input to the latch circuit 9 and are stored therein.

Immediately after the load signal LOAD 1 is turned from H level to L level, on the basis of a signal DIVSEL supplied from outside as a base for division timing, the division timing signal generator circuit 14 selectively turns the division timing signals DIV1 to DIV40 from L level to H level. During this timing period, a strobe signal (inverted STB) is turned from H level to L level and is held at L level for a predetermined period.

As the division timing signals DIV1 to DIV40 are switched in this way, the selecting circuit 11 selects and outputs, from one position after another, the data signals stored in the latch circuit 9 or the correction data storage circuit 10. For example, the division timing signal DIV1 selects the first, ninth, . . . data signals, and the division timing signal DIV2 selects the second, tenth, . . . data signals.

These data signals (with 3-bit correction data signals added thereto as required) are fed to the drive circuit 12. On the basis of the data signals and the correction data signals added thereto, the drive circuit 12 selectively operates the four current amplifiers 12a to 12d so that their output currents are fed via the output terminals provided in the individual terminal section DO to the individual electrodes 28 of the light-emitting devices 22.

In this state, the individual electrodes 28 of all the light-emitting devices 22 are ready to receive currents corresponding to the data signals or correction data signals. However, here, only the n light-emitting parts 26 currently being selected via one of the group-selecting terminals are grounded through the common electrodes 27. Thus, in this example, within each block, only one light-emitting device 22 is selected, and only every eighth light-emitting part 26 thereof is lit selectively.

As described above, by driving a light-emitting device 22 within a block sequentially at a predetermined number of different times, and repeating this a number of times equal to the number of light-emitting devices 22 provided in the block, it is possible to achieve time-division driving (p×q=m divisions) so that light is emitted selectively within the block. By performing this in a plurality of blocks simultaneously, it is possible to emit light that corresponds to one line. By repeating this sequentially, it is possible to achieve the exposure of a whole screen of a electrostatographic printer.

As described above, the driving ICs 1 for driving the light-emitting devices 22 ready for time-division driving within the devices each incorporate the second drive section 3 that operates in synchronism with the timing with which group-by-group driving is performed, and these driving ICs 1 drive the corresponding light-emitting devices 22 on a time-division basis. This helps spread the load. Thus, the maximum load on the second drive section 3 that achieves time-division driving is determined by the number of light-emitting parts 26 that belong to one group within the corresponding light-emitting devices 22. As a result, as compared with a case where all light-emitting devices are driven on a time-division basis by the use of a dedicated IC for time-division driving (for selection among common electrodes) as in the conventional dynamic driving method, it is possible to reduce the load on the circuits that achieve time-division driving.

Moreover, the driving ICs 1 each drive a plurality of light-emitting devices 22 on a time-division basis. Thus, as compared with a case where light-emitting devices 22 and time-division driving ICs are arranged in the ratio of one to one, it is possible to reduce the number of internal circuits. In particular with respect to the drive circuits, which occupy more than half of the area of the ICs, whereas it is necessary to provide q×n drive circuits in a case where light-emitting devices and time-division driving ICs are arranged in the ratio of one to one, it is possible to reduce their number to n in the configuration described above, achieving a reduction factor of 1/q (=1/5). On the other hand, whereas it is necessary to provide p×q×n drive circuits in a case where light-emitting devices and static driving ICs are arranged in the ratio of one to one, it is possible to reduce their number to n in the configuration described above, achieving a high reduction factor of 1/(p×q) (=1/40). In addition, the driving ICs 1 can be configured to have the same shape as conventional static ICs, and thus it is possible to achieve the miniaturization of the overall circuit configuration.

Moreover, despite time-division driving, data can be fed in sequentially as in static driving. Thus, there is no need to provide a circuit for rearranging the data as required in conventional time-division driving. Moreover, even when the number of divisions is increased, it is possible to produce the timing signals DIV1 to DIV40 for time-division driving by the use of a smaller number of signal lines for control signals than the number of division. This makes it possible to reduce the number of terminals of the IC and the number of assembly steps.

Moreover, the driving ICs 1, despite being ready for time-division driving, can store correction data for all of the light-emitting devices within the same block and selectively output the correction data. Thus, in time-division driving using correction data, it is easy to correct data signals on the basis of the stored correction data.

This embodiment is suitable for an optical print head in which, as described above, one driving IC and a plurality of light-emitting devices connected thereto form a block and a plurality of such blocks are arranged in the same direction in which the light-emitting devices are arranged. However, this embodiment find other application; for example, it can be applied to an optical print head or other printing device that has only one such block as its basic structure.

The configuration of the light-emitting devices connected to the driving IC described above may be altered according to the specifications required in the optical print head. Specifically, while the number (n) of individual electrodes of each light-emitting device 22 is kept constant, the number (p) of groups within one light-emitting device 22 and the number (q) of light-emitting devices 22 within one block may be changed as required so that the product of those numbers equals the number (m) of group-selecting terminals of the driving IC 1. For example, one block may be formed with eight light-emitting devices of which the number (p) of divisions is five. Alternatively, one block may be formed with ten light-emitting devices of which the number (p) of divisions is four. Here, it is possible to select light-emitting devices having light-emitting parts arranged at a different density, and this enhances the versatility of the driving IC.

In the driving IC described above, the number of time divisions (m) is set at 40. However, by feeding in data in a special manner, it is possible to change the apparent number of time divisions (the effective number of time divisions) according to the printing speed or the like required in the optical print head. For example, in a case where high-speed printing is required and thus the number of time divisions need to be changed to a value k that is smaller than m, the data processing circuit that feeds signals to the driving IC 1 is made to operate in such a way that the effective number of division timing signals DIV is reduced to k. Specifically, in a case where the division timing signal generator circuit 14 is of an up-counter type, when the number of divisions exceeds k, the clock frequency of the control signal DIVSEL is increased so that the remaining timing signals DIVk+1 to DIV40 are produced in an extremely short period, and meanwhile the strobe signal (inverted STB) is held at H level so as to inhibit the printing of data in the shortened period. In a case where the division timing signal generator circuit 14 is of a decoder type, by modifying, according to the desired number k of divisions, the multiple-bit control signal DIVSEL that the data processing circuit outputs, it is possible to selectively produce only the timing signals DIV1 to DIVk. In this way, by changing the number (m) of divisions of the driving IC 1 so that the effective number (k) of divisions is set at, for example, 16, connecting two light-emitting devices 22 as shown in FIG. 6 to the driving IC 1 to form one block, and arranging ten such blocks to form an optical print head having 7,680 light-emitting parts, it is possible to increase the printing speed 40/16=2.5 times as compared with the case where the number (m) of time divisions is 40 described above with reference to FIG. 3.

Another known way to increase the printing speed is to increase the current that is passed through the individual light-emitting parts so that they produce higher light output. However, in cases where the current cannot be increased, for example when the current before being increased is already close to the maximum current permitted by the light-emitting parts, or when the current is intentionally kept low to extend the working life of the light-emitting parts, it is preferable to increase the printing speed by reducing the effective number of time divisions as described above.

In this way, while using the same driving IC, it is possible to adapt to a change in the printing speed required in a print head by changing the effective number of time divisions, and thereby adapt to a change in the functions of the print head.

Second Embodiment

Figure 8:
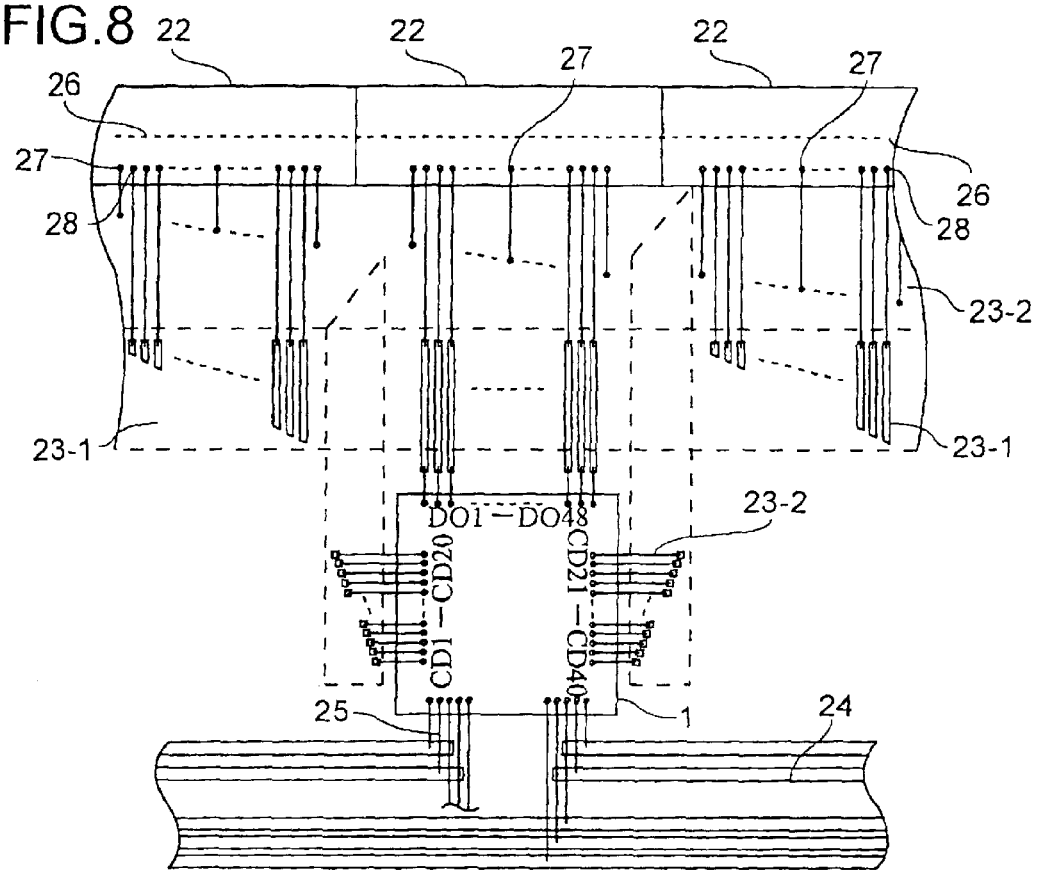
FIG. 8 is a plan view of a principal portion of the optical print head of the second embodiment.
Figure 9:
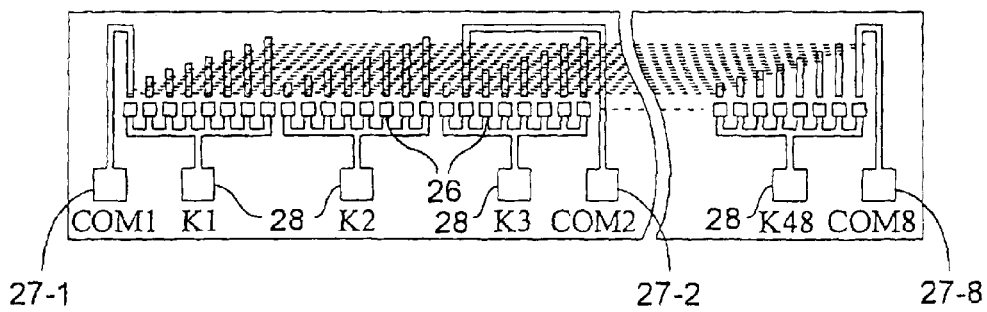
FIG. 9 is a plan view of a principal portion of the light-emitting device of the second embodiment.

Next, a second embodiment of the invention will be described. FIG. 8 is a plan view showing a principal portion of the optical print head of this embodiment. FIG. 9 is a plan view showing a principal portion of the light-emitting device of this embodiment. In this embodiment, the driving IC is configured in the same manner as in the first embodiment, and thus as shown in FIGS. 1 and 2, and operates in the same manner as in the first embodiment, and thus as shown in the timing chart of FIG. 3. In FIGS. 8 and 9, such elements as are found also in FIGS. 5 and 6 are identified with the same reference numerals, and their explanations will not be repeated.

With respect to the conductors that connect the driving IC 1 and the light-emitting devices 22 together, in the first embodiment, as shown in FIG. 5, the first conductors 23-1 are arranged below the light-emitting devices 22, the second conductors 23-2 are arranged above the light emitting devices 22, and these conductors are connected to the light-emitting devices 22 on both sides thereof by wire-bonded leads. By contrast, in this embodiment, as shown in FIG. 8, the second conductors 23-2, which are connected to the output terminals CD1 to CD40 for group selection of the driving IC 1, are arranged below the light-emitting devices 22, the first conductors 23-1, which are connected to the output terminals DO1 to DO48 of the driving IC 1, are arranged further below the second conductors 23-2, and these conductors are connected to the light-emitting devices 22 on one side thereof by wire-bonded leads. That is, the portions of the conductor patterns of the first and second conductors 23-1 and 23-2 which have substantially the same length as the total length along which the light-emitting devices 22 are arranged are arranged on only one side of the row of the light-emitting devices 22.

As in the first embodiment, the light-emitting devices 22 that are electrically connected to the driving IC 1 by the first and second conductors 23-1 and 23-2 in this way each have a plurality of (p×n=384) light-emitting parts 26 arranged on the top surface thereof, along the longer sides thereof and at a density of about 1,200 DPI. These light-emitting parts 26 are formed independently of each other so that they can be driven on a time-division basis. Specifically, the light-emitting parts 26 are divided into a plurality of (p) groups so that they can be driven in groups of n. As in the first embodiment, in this embodiment is dealt with an example in which the light-emitting parts 26 are divided into 8 groups on the basis of the remainder that remains when the number representing the order of arrangement of each light-emitting part 26 is divided by a division number p (8).

As shown in FIG. 9, on the light-emitting device 22 are laid eight common electrodes 27, consisting of a common electrode 27-1 that is connected to the light-emitting parts 26 belonging to the first group on a common basis, a common electrode 27-2 that is connected to the light-emitting parts 26 belonging to the second group on a common basis, . . . , and a common electrode 27-8. Also laid are n (48) individual electrodes 28 of which each is connected to eight consecutive light-emitting parts 26. Whereas, in the first embodiment, the common electrodes 27 and the individual electrodes 28 are arranged on both sides of the light-emitting parts 26 and along the longer sides of the light-emitting device 22 as shown in FIG. 6, in this embodiment, they are arranged on one side of the light-emitting parts 26 and along the longer sides of the light-emitting device 22.

Thus, in this embodiment, the configuration and operation of the optical print head are the same as in the first embodiment except for the configuration of the light-emitting device 22 and its relationship with the first and second conductors 23-1 and 23-2. Therefore, no further explanations of this embodiment will be given, and instead reference is to be made to the description of the first embodiment.

Third Embodiment

Figure 10:
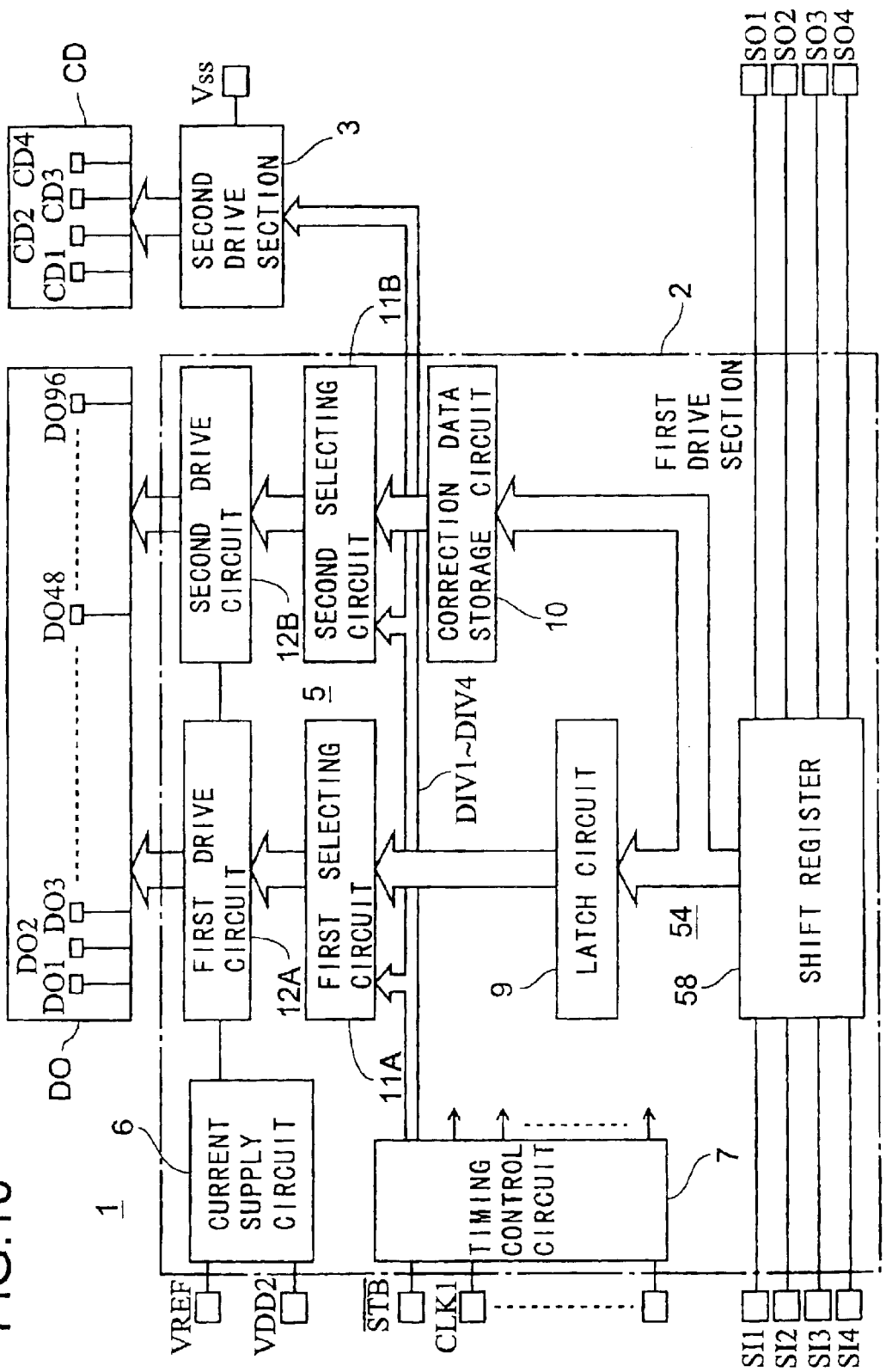
FIG. 10 is a circuit block diagram of the driving IC of a third embodiment of the invention.
Figure 11:
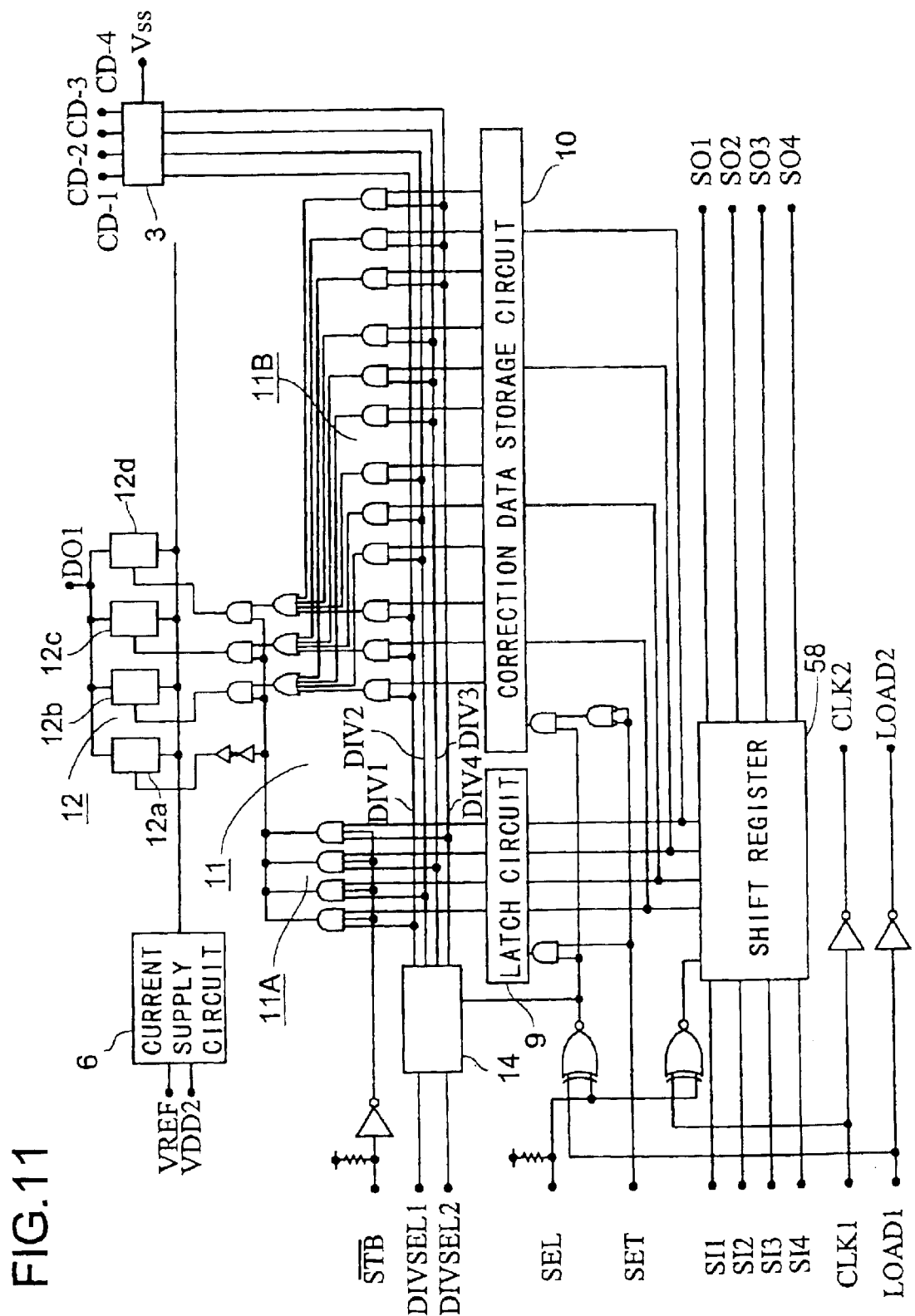
FIG. 11 is a circuit block diagram of a principal portion of the driving IC of the third embodiment.

FIG. 10 is a circuit block diagram showing the basic configuration of the driving IC of a third embodiment of the invention. FIG. 11 is a circuit block diagram of a principal portion of the circuit block diagram of FIG. 10, specifically the portion associated with one DO1 among a plurality of output terminals DO1 to DO96. First, descriptions will be given with reference mainly to these figures.

The driving IC 1 shown in FIG. 10 differs from the driving IC 1 shown in FIG. 1 in that the data signal storage circuit 54 has a multiple-input shift register 58 of an n×m bit type that takes in data signals serially fed in via data input terminals SI1 to SI4 in synchronism with the clock signal CLKI and that outputs the data signals serially via data output terminals SO1 to SO4. Therefore, such elements as are found also in FIG. 1 are identified with the same reference numerals, and their explanations will not be repeated. The individual terminal section DO consists of a plurality of (n) output terminals DO1 to DO96 for driving light-emitting devices, and the common terminal section CD consists of a plurality of (m) output terminals CD1 to CD4 for selecting groups.

The following descriptions deal with a case where n=96 and m=4 as shown in the figures. However, it is to be understood that the present invention may be implemented in any other manner than specifically described below. When n=96 and m=4, the shift register 58 is of a 384 bit type, and accordingly the latch circuit 9 also is of a 384 bit type because, on the basis of the load signal LOAD1, it needs to take in, in groups of 384 bits, the data signals taken in by the shift register 58.

In the drive circuit 5, the selecting circuit 11A sequentially selects and outputs, in groups of n, the m×n (384) data signals output from the latch circuit 9, and the first drive circuit 12A, which outputs a predetermined current via the output terminals DO1 to DO96 on the basis of the output of the first selecting circuit 11A, is of an n (96) bit type. Moreover, the correction data storage circuit 10 stores n×m (384) correction data signals for output correction, and the second selecting circuit 11B sequentially selects, in groups of n, the n×m (384) correction data signals output from the correction data storage circuit 10. Furthermore, the second drive circuit 12B, for correction, is of an n (96) bit type because it outputs, as driving signals via the output terminals DO1 to DO96, current outputs of which the current is adjusted on the basis of the output from the second selecting circuit 11B for correction data.

As in the first embodiment, the storage circuit 10 is configured as, for example, a latch circuit of an S×n×m bit type so that it can store n×m (384) correction data signals each consisting of S bits (for example, 3 bits). The writing of correction data signals to the correction data storage circuit 10 is achieved on the basis of the signals fed parallel, in groups of n×m, from the shift register 58.

The division timing signal generator circuit 14 here, as opposed to that of the first embodiment, produces division timing signals (DIV1 to DIV4) on the basis of two signals DIVSEL1 and DIVSEL2 that are supplied from outside to determine the timing of time division, as shown in the truth table in Table 1.

TABLE 1

| DIVSEL1 | DIVSEL2 | Selected |
|---------|---------|----------|
| H | H | DIV4 |
| H | L | DIV3 |
| L | H | DIV2 |
| L | L | DIV1 |

Next, with reference to FIG. 11, the flow of data will be described with respect mainly to one output terminal DO1. As the division timing signals DIV1 to DIV4 are turned to H level one by one, four AND gate circuits provided in the first selecting circuit 11A and connected to those division timing signals DIV1 to DIV4 and to the latch circuit 9 are opened one by one. Thus, the data signals corresponding to the whole IC that are stored in the latch circuit 9 (384 pieces of on/off data) are selectively output through the AND gate circuit that is open at each moment. In the example shown in FIG. 11, the first to fourth data signals within one IC are sequentially used to drive the drive circuit 12. Similarly, as the division timing signals DIV1 to DIV4 are turned to H level one by one, AND gates circuit provided in sets of three in the second selecting circuit 11B are opened one set after another. Thus, the three-bit correction data signals stored in the correction data storage circuit 10 are selectively output through the set of AND gate circuits that is open at each moment. The output of the correction data storage circuit 10 is fed to the drive circuit 12 so as to selectively operate, together with the data signals fed from the latch circuit 9 through the first selecting circuit 11A, the three current amplifiers 12b to 12d.

Next, the second drive section 3 will be described. The second drive section 3 is a circuit for selectively switching one of the output terminals CD1 to CD4 to the ground potential VSS, and performs the switching in synchronism with the division timing signals DIV1 to DIV4. The switching may be achieved by the use of other signals that are synchronous with the division timing signals DIV1 to DIV4.

Figure 14:
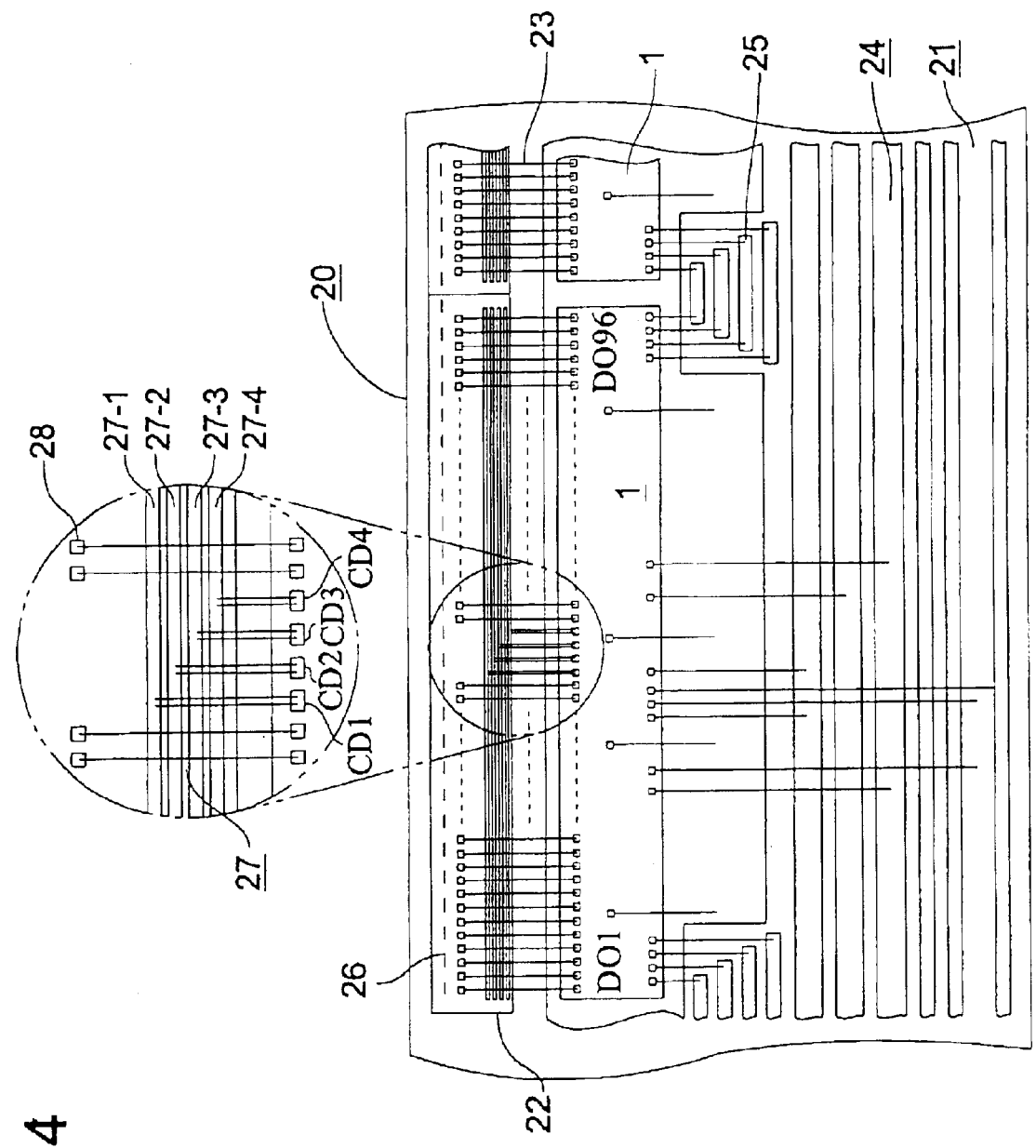
FIG. 14 is a plan view of a principal portion of the optical print head of the third embodiment.

FIG. 14 is a plan view showing a principal portion of an example of an optical print head 20, which employs, as the driving ICs 1, the driving IC described in the third and fourth embodiments of the invention. This optical print head 20 has a plurality, for example 20, of light-emitting devices 22 arranged in a row on an insulating substrate 21, and has driving ICs 1 arranged in a row on one side of and adjacent to the light-emitting devices 22 in such a way that the driving ICs 1 correspond one to one to the light-emitting devices 22. In this example, the driving ICs 1 are arranged on one side of the light-emitting devices 22. In a case where the driving ICs 1 are arranged on both sides of the light-emitting devices 22, they are arranged in such a way that one of the light emitting devices 22 corresponds to two of the driving ICs 1. Between the light-emitting devices 22 and the driving ICs 1 are laid conductors 23 for connecting them together. The conductors 23 may be realized by direct connection using wire-bonded leads of gold or the like, or indirect connection using wire-bonded leads in combination with an interposed relay pattern, or with high-density flexible wires connected by the use of anisotropic conductive adhesive.

On the substrate 21, a plurality of conductor patterns 24 for signal transmission and power supply are laid so as to extend in the direction of arrangement of the light-emitting devices 22. Between the driving ICs 1 and the conductor patterns 24 are laid conductors 25 similar to the conductors 23.

Each light-emitting device 22 has a plurality of (m×n=384) light-emitting parts 26 arranged on the top surface thereof, along the longer sides thereof. These light-emitting parts 26 are formed independently of each other so that they can be driven on a time-division basis. Specifically, the light-emitting parts 26 are divided into a plurality m of groups so that they can be driven group by group on a time-division basis. In this example, the light-emitting parts 26 are divided into 4 groups on the basis of the remainder that remains when the number representing the order of arrangement of each light-emitting part 26 is divided by 4. Specifically, here, of all the light-emitting parts 26, the first, fifth, ninth, . . . belong to a first group, the second, sixth, tenth, . . . belong to a second group, the third, seventh, eleventh, . . . belong to a third group, and the fourth, eighth, twelfth, . . . belong to a fourth group.

Moreover, on the light-emitting device 22 are laid four common electrodes 27, consisting of a common electrode 27-1 that is connected to the light-emitting parts 26 belonging to the first group on a common basis, a common electrode 27-2 that is connected to the light-emitting parts 26 belonging to the second group on a common basis, a common electrode 27-3, and a common electrode 27-4. Also laid are n (96) individual electrodes 28 of which each is connected to four consecutive light-emitting parts 26. The individual electrodes 28 are connected individually to the output terminals DO1 to DO96 of the corresponding driving IC 1, and the common electrodes 27 are connected to the output terminals CD1, CD2, CD3, and CD4 of the same driving IC 1. By selecting one among the common electrodes 27 and energizing appropriate ones of the individual electrodes DO, it is possible to light the light-emitting parts 26 on a time-division basis, one-fourth of them at a time.

In this example, there are provided L (20) light-emitting devices 22. Thus, in the entire head 20 are provided L×m×n=20×4×96=7,680 light-emitting parts 26 in total.

Figure 15:
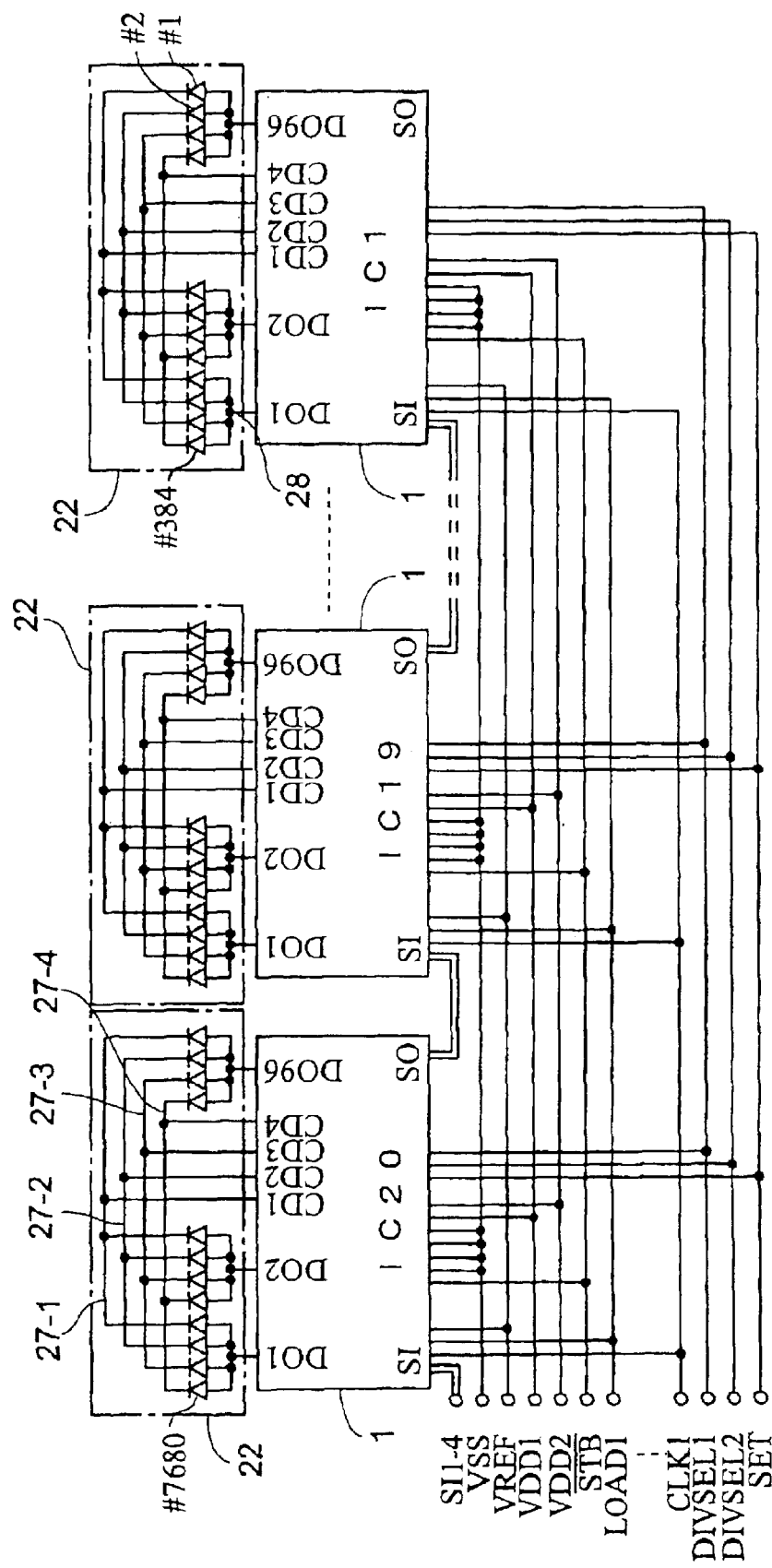
FIG. 15 is a circuit block diagram of the optical print head of the third embodiment.

FIG. 15 is a circuit block diagram of the optical print head 20. The optical print head 20 has 20 light-emitting devices 22 arranged in a row. The numbers starting with a # represent the serial numbers of the light-emitting parts 26 throughout the optical print head 20. The individual electrodes 28 are each connected to one of the light-emitting parts 26 (to the anode thereof) of each of the four groups on a common basis, and the cathodes of the light-emitting parts 26 belonging to each of the four groups are connected to the common electrodes 27-1, 27-2, 27-3, and 27-4 respectively. The individual electrodes 28 are connected to the individual terminals DO1 to DO96 of the corresponding driving IC 1. The common electrodes 27-1, 27-2, 27-3, and 27-4 are connected to the output terminals CD1, CD2, CD3, and CD4 respectively. The data input terminals SI1 to SI4 of the first driving IC 1 are connected to the data output terminals SO1 to SO4 of the second driving IC 1. Likewise, the data input terminals SI1 to SI4 of the second to nineteenth driving ICs 1 are connected to the data output terminals SO1 to SO4 of the driving ICs 1 that are assigned numbers greater by one than those. Data signals fed in from outside are fed to the data input terminals SI1 to SI4 of the twentieth driving IC 1. The driving ICs 1 each receive a supply voltage VDD1, external signals DIVSEL1 and DIVSEL2, a load signal LOAD1, and other signals. It is to be noted that, in FIG. 15, SI represents SI1 to SI4 and SO represents SO1 to SO4.

Figure 13:
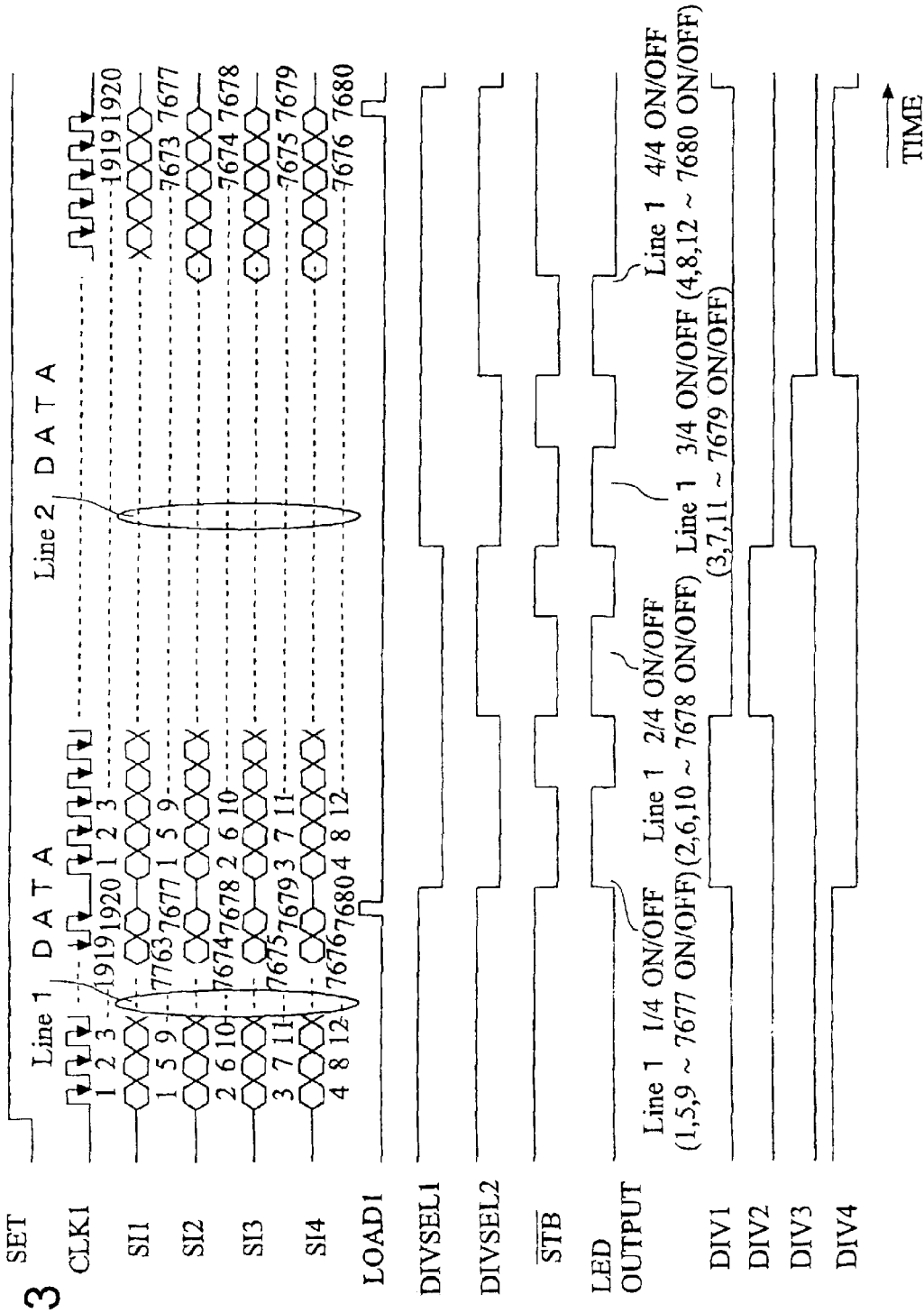
FIG. 13 is a timing chart of the third embodiment.

Next, the operation of the optical print head 20 described above, including the operation of the driving IC 1 of the third embodiment, will be described with reference to, in addition to FIGS. 10 and 11, an example of the circuit configuration of the optical print head shown in FIG. 15 and the timing chart shown in FIG. 13. Here, it is assumed that the correction data to be stored in the storage circuit 10 has already been stored therein.

First, the set signal SET is turned from L level to H level. As a result, the storage circuit 10 is brought into a write disable state.

Data signals (7,680 signals) are fed sequentially, in groups of r, to the data input terminals SI1 to SI4 of the twentieth driving IC 1, and are taken in sequentially by the multiple-input shift registers 58 of the individual driving ICs 1 in synchronism with the clock signal CLK1. Here, the data signals that are fed to the input terminals SI1 to SI4 are fed in in a form divided in advance so as to correspond to the four groups of light-emitting parts; specifically, the first, fifth, ninth, . . . data signals are fed to the input terminals SI1, the second, sixth, tenth, . . . data signals are fed to the input terminals SI2, and so forth. When the input of data signals to the shift register 58 of one driving IC 1 is complete, the data signals are fed, via the output terminals SO1 to SO4 thereof, to the shift register 58 of the adjacent driving IC 1. Inputting the data signals via multiple paths in this way helps greatly reduce the time required to input the data signals as compared with a case where they are input via a single path.

When the input of data signals corresponding to one line is complete, the load signal LOAD 1 is held at H level for a predetermined period so that the n×m data signals held in the shift registers 8 of the individual driving ICs 1 are input. Here, the latch circuit 9 selects (latches) data signals on a trailing edge of the load signal LOAD 1, and therefore the n×m data signals taken in by the shift register 8 are input to the latch circuit 9 and are stored therein.

Immediately after the load signal LOAD 1 is turned from H level to L level, the external signals DIVSEL1 and DIVSEL2 indicating the timing of light emission are both held at L level, and simultaneously, of the division timing signals output from the division timing signal generator circuit 14, only DIV1 is turned from L level to H level. Immediately thereafter, the external strobe signal (inverted STB) indicating the timing of emission is turned from H level to L level and is then held at L level for a predetermined period, during which the light-emitting devices are lit selectively.

Immediately after the load signal LOAD 1 is turned from H level to L level, the external signals DIVSEL1 and DIVSEL2 indicating the timing of light emission are both held at L level, and simultaneously, of the division timing signals output from the division timing signal generator circuit 14, only DIV1 is turned form L level to H level. Immediately thereafter, the external strobe signal (inverted STB) indicating the timing of the light emission is turned from H level to L level and is then held at L level for a predetermined period, during which the light-emitting devices are lit selectively.

Then, by changing the combination of the external signals DIVSEL1 and DIVSEL2, only DIV2 among the division timing signal is turned to H level. Then, in similar manners, only DIV3, and then only DIV4, is turned to H level.

As the division timing signals DIV1 to DIV4 are switched in this way, the selecting circuit 11 selects and outputs, from one position after another, the data signals stored in the latch circuit 9 or the corrections data storage circuit 10. For example, the division timing signal DIV1 selects the first, fifth, . . . , and 7,677th data signals, and the division timing signal DIV2 selects the second, sixth, . . . , and 7,678th data signals.

These data signals (with 3-bit correction data signals added thereto as required) are fed to the drive circuit 12. On the basis of the data signals and the correction data signals added thereto, the drive circuit 12 selectively operates the four current amplifiers 12a to 12d so that their output currents are fed via the output terminals DO to the individual electrodes 28 of the light-emitting devices 22.

In this state, the individual electrodes 28 of all the light-emitting devices 22 are ready to receive currents corresponding to the data signals of correction data signals. However, here, only one-fourth of the light-emitting parts 26 are grounded through the common electrodes 27. Thus, in this example, only every forth light-emitting part 26 is selectively lit while the strobe signal (inverted STB) is held at L level.

By driving the light-emitting parts on a time-division basis, ie. one-fourth of them at a time, to achieve light emission for one line as described above, and then repeating this sequentially, it is possible to achieve the exposure of a whole screen.

As described above, despite time-division driving, data signals corresponding to one line can be input in a single sequence of processing. Thus, there is no need to input data signals sequentially at a number of different times equal to the number of divisions as required in conventional configurations. In particular, the number (m) of groups is set equal to the number (r) of data input terminals. This makes it possible to input data signals in a form divided in advance so as to correspond to the group, and thus makes the input of data signals easier.

Figure 16:
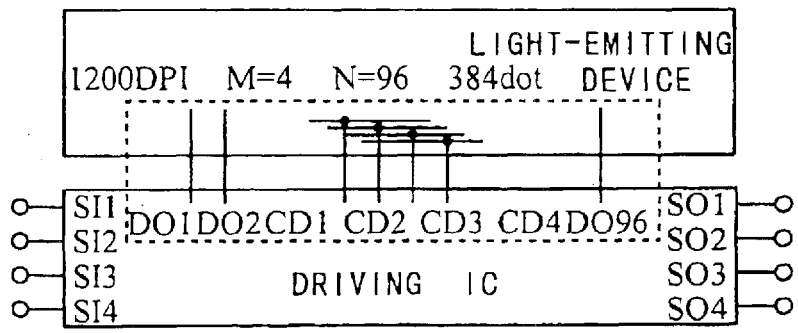
FIG. 16 is a diagram schematically showing the configuration of the characteristic portion of the third embodiment.

The driving IC 1 of this embodiment can easily be adapted for the driving of light-emitting devise having a resolution other than 1,200 DPI. Now, examples of such adaptation will be described with reference to FIG. 16 to 21, which schematically show various configurations, and FIG. 22 to 25, which show timing charts. FIG. 16 schematically shows the configuration corresponding to the optical print head configured as described above.

Figure 17:
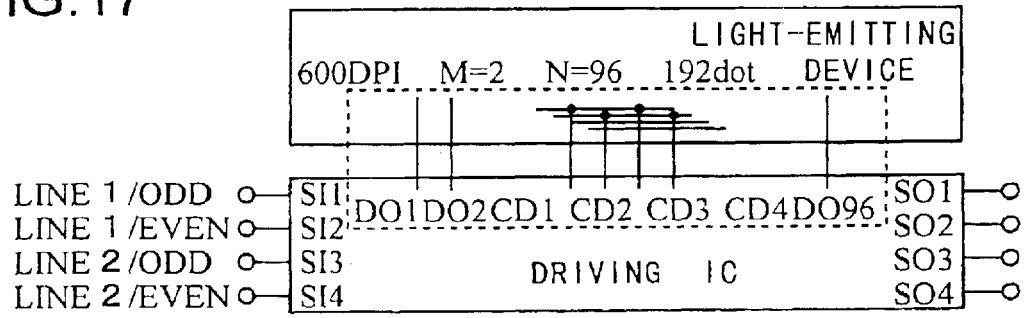
FIG. 17 is a diagram schematically showing the configuration of the characteristic portion when applied to a light-emitting device configured differently from that of the third embodiment.

FIG. 17 shows the configuration of an optical print head that employs a light-emitting device having two common electrodes (M=2), 96 individual electrodes (N=96), and a resolution of 600 DPI. That is, this optical print head employs, as the light-emitting device 22, a light-emitting device of a two division type that has an external shape similar to that of the light-emitting device 22 shown in FIG. 14 and described earlier but that has light-emitting parts 26 arranged at half the density thereof and divide into two groups(M=2), i.e. odd-numbered numbered and even-numberedgroups. The driving IC 1, by using two inputs SI1 and AI2, performs the input of data signals corresponding to one line with 1,920 clock pulses and, by using the other two inputs SI3 and SI4, simultaneously performs the input of data signals corresponding to the next line. To cope with these changes, data signals need to be input in an accordingly altered manner. Except for these changes, this optical print head has the same configuration as the optical print head 20 (FIG. 16) described earlier. Thus, as shown in a timing chart in FIG. 22, after data signals corresponding to two lines have been taken in in a single data input sequence, the first group (the odd-numbered data signals) of the first line is selected by the division timing signal DIV1, then the second group (the even-numbered data signals) of the first line is selected by the division timing signal DIV2, then the first group (the odd-numbered data signal) of the second line is selected by the division timing signal DIV3, and then the second group (the even-numbered data signal) of the second line is selected by the division timing signal DIV4.

Figure 18:
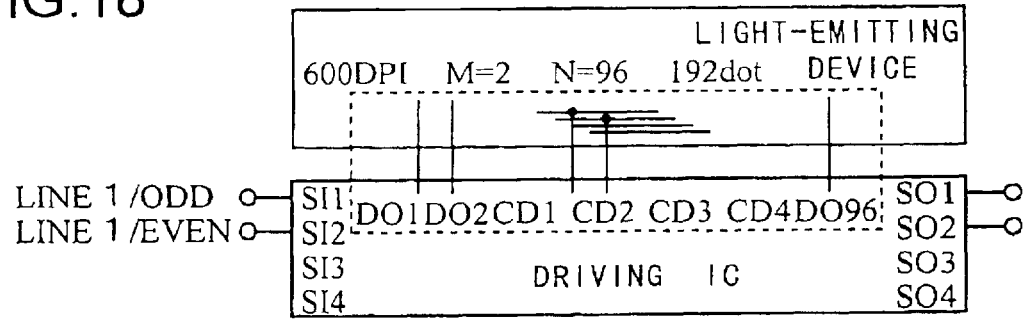
FIG. 18 is a diagram schematically showing the configuration of the characteristic portion when applied to a light-emitting device configured differently from that of the third embodiment.

Here, by leaving the other two inputs SI3 and SI4 unused as shown in FIG. 18, the optical print head is so configured as to deal with only data signals corresponding to one line This makes it possible to use the driving IC 1 designed for 1,200 DPI to drive a 600 DPI light-emitting device 22.

Figure 19:
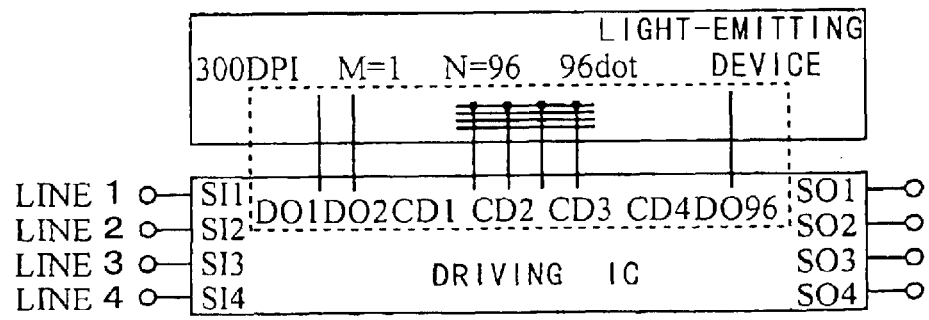
FIG. 19 is a diagram schematically showing the configuration of the characteristic portion when applied to a light-emitting device configured differently from that of the third embodiment.

FIG. 19 shows the configuration of an optical print head that employs a 300 DRI light-emitting device. That is, this optical print head employs as the light-emitting device 22 a light-emitting device of a non-division type that has an external shape similar to that of the light-emitting device 22 shown in FIG. 14 and described earlier but that has light-emitting portions 26 arranged at one-fourth of the density thereof and grouped into a single group (M=1). As shown in a timing chart in FIG. 23, the input of data signals to the driving IC 1 is performed by using four inputs SI1 to SI4 so that data signals corresponding to four lines are input with 1,920 clock pulses. To cope with these changes, data signals need to be input in an accordingly altered manner. Except for these changes, this optical print head has the same configuration as the optical print head 20 (FIG. 16) described earlier. This makes it possible to use the driving IC 1 designed for 1,200 DPI to drive a 300 DPI light-emitting device 22. Moreover, it is possible to input data signals corresponding to four lines in a single data input sequence. This helps enhance the data processing performance performance and increase the printing speed.

Figure 20:
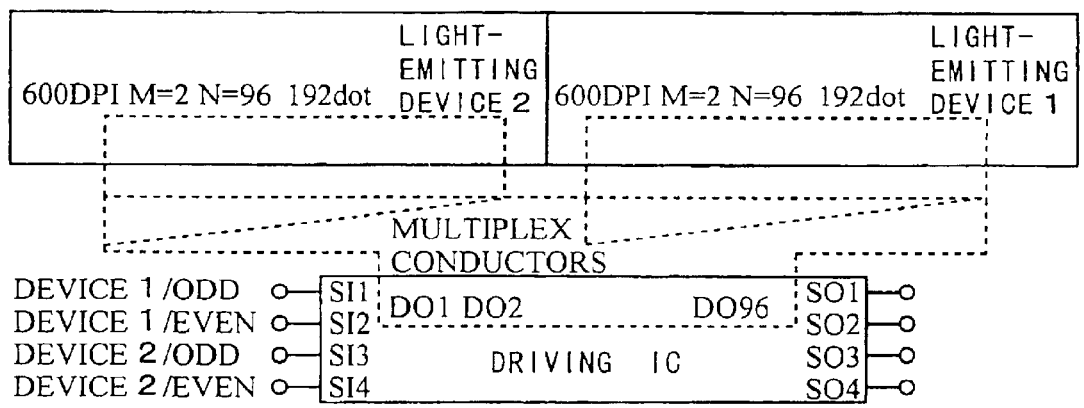
FIG. 20 is a diagram schematically showing the configuration of the characteristic portion when applied to a light-emitting device configured differently from that of the third embodiment.

FIG. 20 shows the configuration of an optical print head that employs 600 DPI light-emitting devices. That is, this optical print head employs as the light-emitting device 22 two light-emitting devices of a two division type that each have the same length as the light-emitting device 22 shown in FIG. 14 and describing earlier but that have light-emitting parts 26 arranged at half the density thereof, i.e. 600 DPI, and divided into two groups (M=2). These light-emitting devices are arranged along the longer sides of themselves and are connecting to the driving IC by multiplex conductors. As shown in a timing chart in FIG. 24, the driving IC 1 performs the input of odd-numbered data signals of one light-emitting device by using one input SI1 thereto, performs the input o even-numbered data signals of that light-emitting device by using the next input SI2, performs the input o odd-numbered data signals of the light-emitting devices by using the next unput SI3, and performs the input of even-numbered data signals of that light-emitting device by using the next input SI4 so that data signals corresponding to one line are input with 960 clock pulses. To cope with these changes, data signals need to be input in an accordingly altered manner. Except for these changes, this optical print head has the same configuration as the optical print head 20 (FIG. 16) described earlier. This makes it possible to use the driving IC1 designed for 1,200 DPI to drive 600 DPI light-emitting devices 22. Moreover, it is possible to form a unit (block) consisting of one driving IC and two light-emitting devices and arrange a plurality of such units along the longer sides of the substrate 21. This helps reduce the number of diving ICs.

Figure 21:
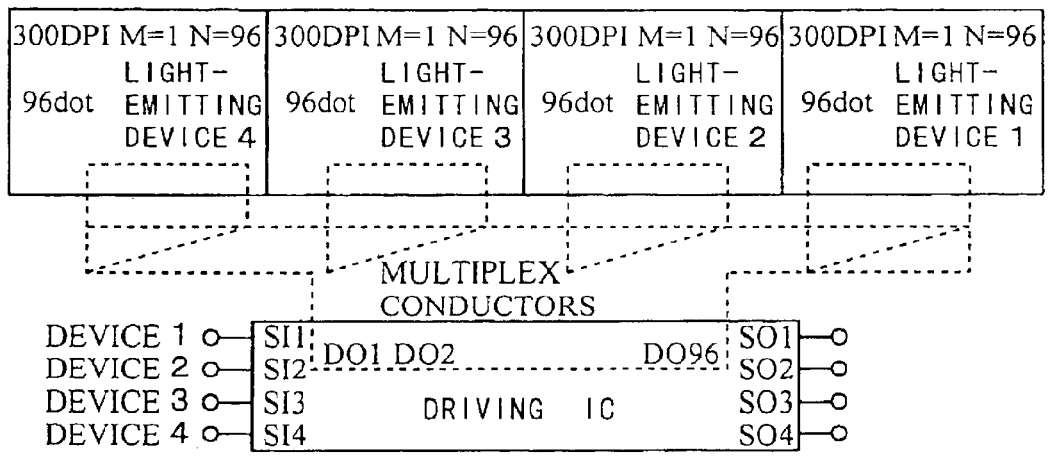
FIG. 21 is a diagram schematically showing the configuration of the characteristic portion when applied to a light-emitting device configured differently from that of the third embodiment.
Figure 22:
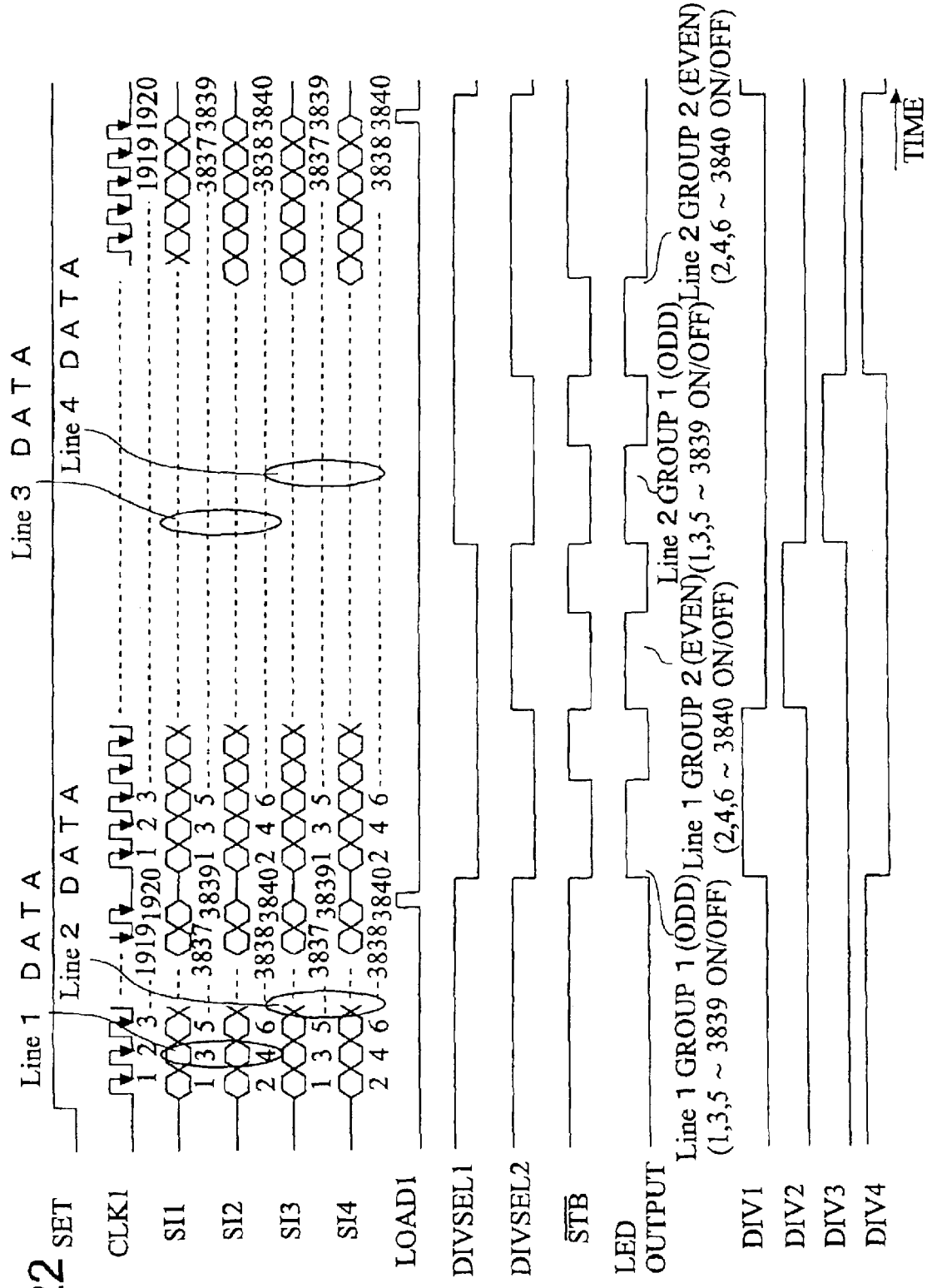
FIG. 22 is a timing chart showing the operation of the optical print head of FIG. 17.
Figure 23:
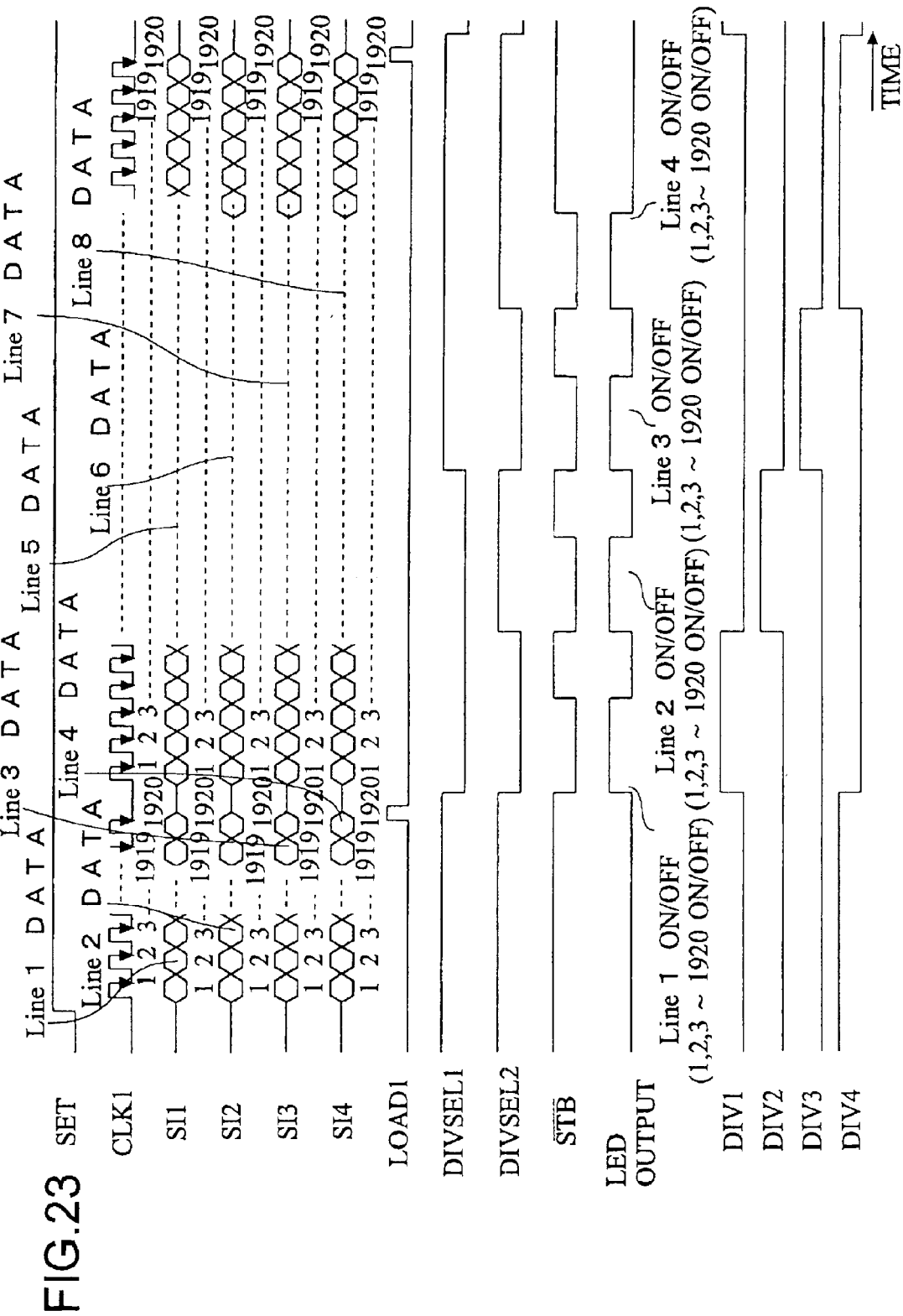
FIG. 23 is a timing chart showing the operation of the optical print head of FIG. 19.
Figure 24:
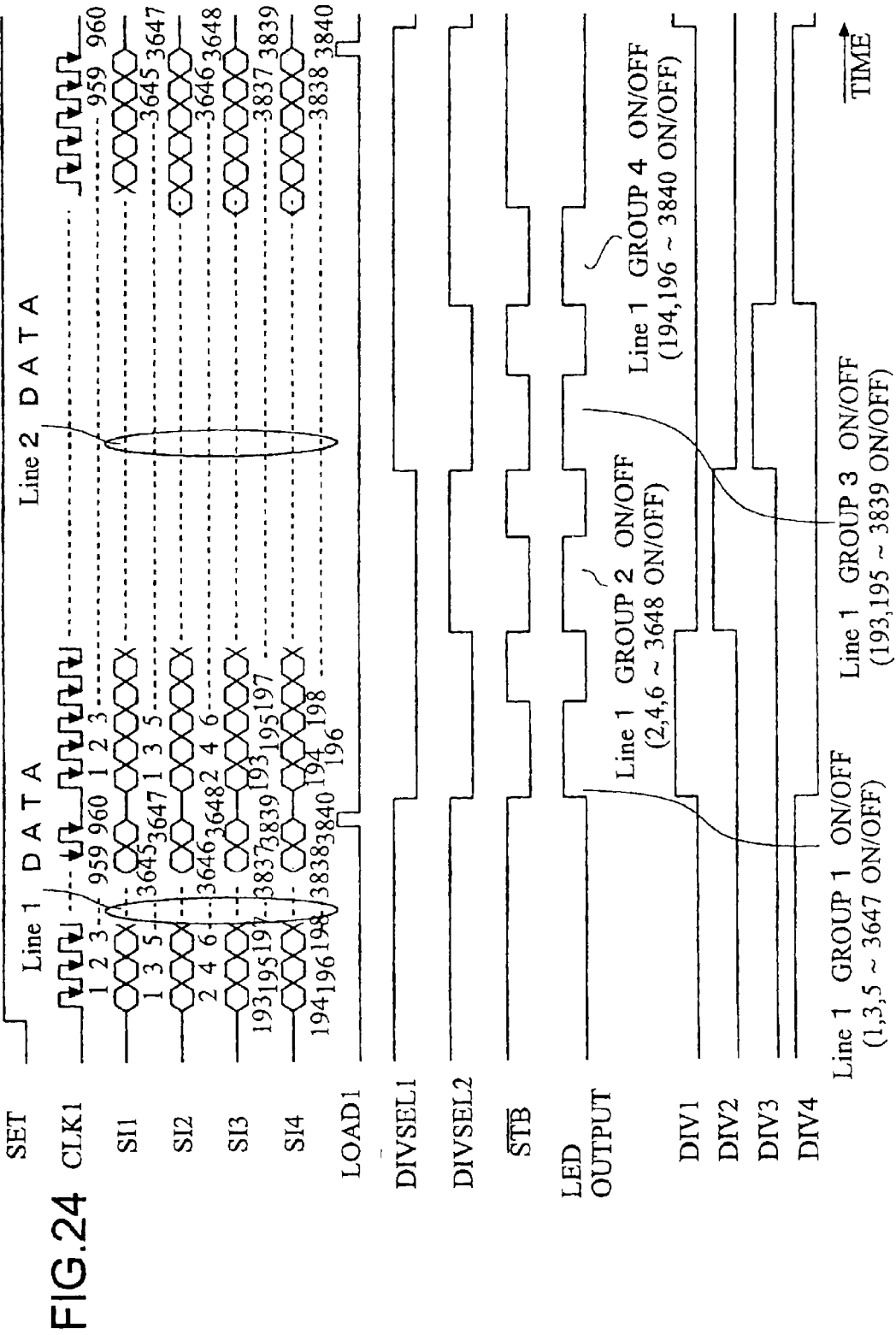
FIG. 24 is a timing chart showing the operation of the optical print head of FIG. 20.
Figure 25:
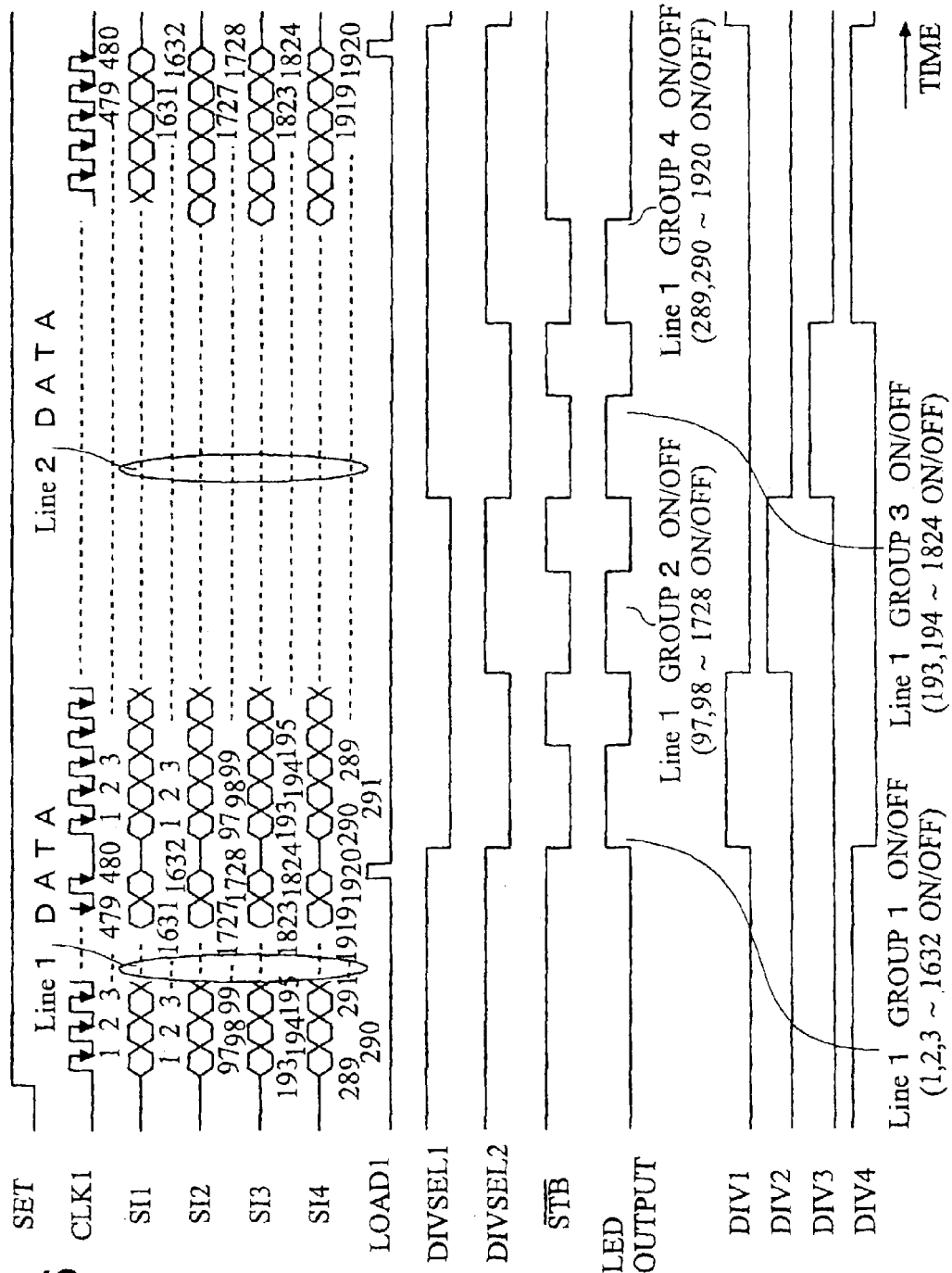
FIG. 25 is a timing chart showing the operation of the optical print head of FIG. 21.

FIG. 21 shows the configuration of an optical print head that employs 300 DPI light-emitting devices. That is, this optical print head employs as the light-emitting device 22 four light-emitting devices of a non-division type that each have the same length as the light-emitting device 22 shown in FIG. 14 and described earlier but that have light-emitting parts 26 arranged at one-fourth of the density thereof, i.e. 300 DPI, and grouped into a single group (M==1). These light-emitting devices are arranged along the longer sides of themselves and are connected to the driving IC by multiplex conductors. As shown in a timing chart in FIG. 25, the driving IC 1 performs the input of data signals of the first light-emitting device by using one input SI1 thereto, performs the input of data signals of the second light-emitting device by using the next input SI2, performs the input of data signals of the third light-emitting device by using the next input SI3 and performs the input of data signals of the fourth light-emitting device by using the next input SI4 so that data signals corresponding to one line are input with 480 clocks. To cope with these changes, data signals needs to be input in an accordingly altered manner. Except for these changes, this optical print head has the same configuration as the optical print head 20 (FIG. 16) described earlier. This makes it possible to. use the driving IC 1 designed for 1,200 DPI to drive 300 DPI light-emitting devices 22. it is possible to form a unit (block) consisting of one driving IC and four light-emitting devices and arrange a plurality of such units along the longer sides of the substrate 21. helps reduce the number of driving ICs.

Fourth Embodiment

Figure 26:
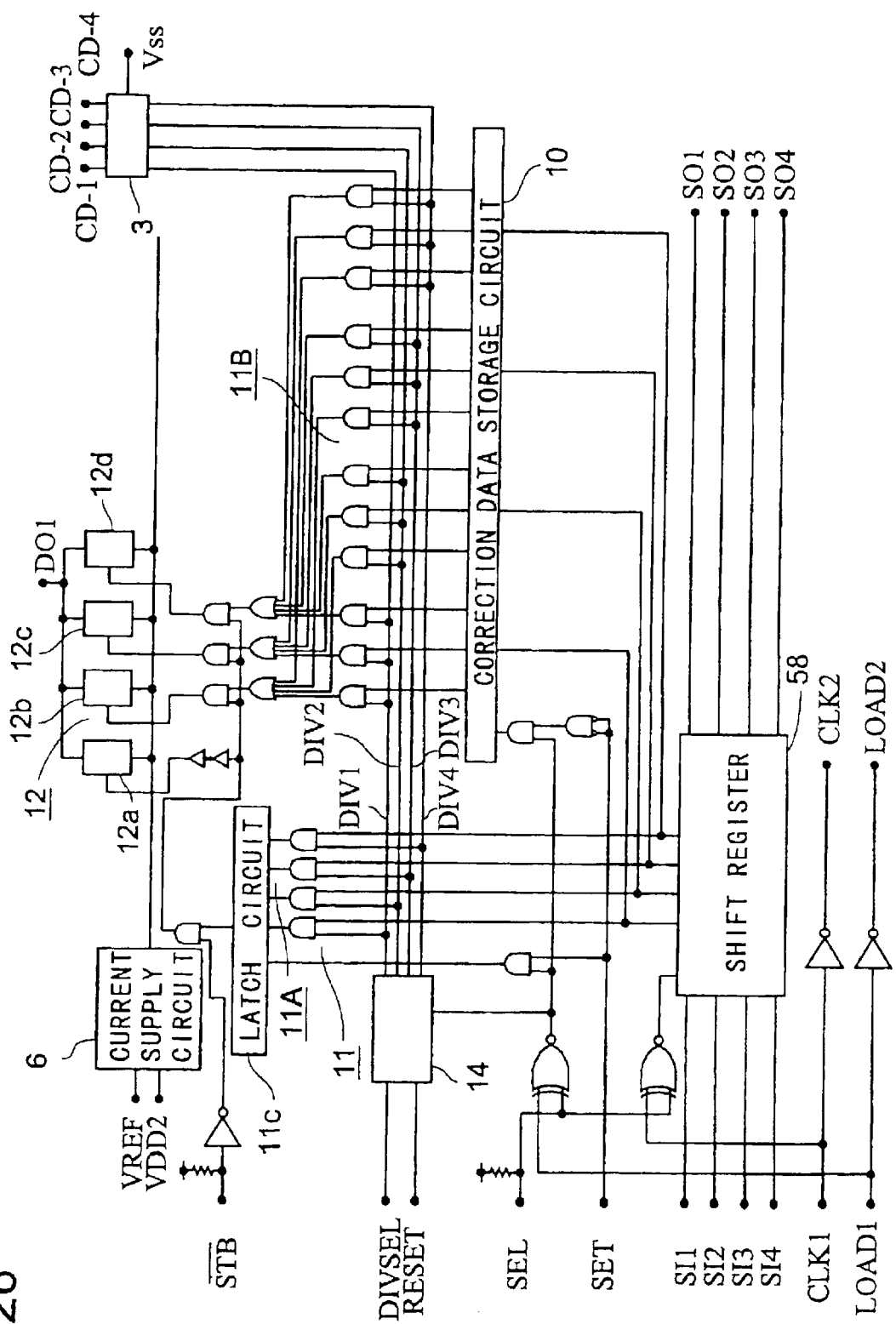
FIG. 26 is a circuit block diagram of a principal portion of the driving IC of a fourth embodiment of the invention.

Next, a fourth embodiment of the invention will be described. FIG. 26 is a circuit block diagram of a principal portion of the driving IC 1 of the fourth embodiment, specifically the portion associated with one DO1 among a plurality of output terminals DO1 to DO96. In this embodiment, a latch circuit 11C is used that stores a smaller number of data signals than the data signals stored in the shift register 58. Now, this embodiment will be described with reference to FIGS. 26 and 27.

This embodiment differs greatly from the third embodiment in that the selecting circuit that supplies, in groups of n, the plurality of (m×n) data signals stored in the shift register to the driving circuit 12 is realized with a latch circuit 11C that stores the same number of data signals as the output terminals DO1 to DO96 (n=96) and a selecting circuit 11A that selectively feeds data signals to the latch circuit 11C.

As shown in FIG. 26, the plurality of (m×n=384) data signals stored in the shift register 58 are fed through the selecting circuit 11A composed of logic gate circuits to the latch circuit 11C. The latch circuit 11C is configured as a latch of an n (96) bit type that stores the same number of data signals as the output terminals DO1 to DO96, and takes in data signals in groups of n on the basis of the signal LOAD 1. On the basis of the division timing signals DIV1 to DIV4 output from the division timing signal generator circuit 14, the selecting circuit 11A selects n data signals among the plurality of (m×n=384) data signals output from the shift register 58, and feeds them to the latch circuit 11C. The data signals stored in the shift register 58 are sequentially fed to the latch circuit 11C as a result of such selecting operation repeated m times. The n data signals output from the latch circuit 11C are fed to the driving circuit 12 while the strobe signal (inverted STB) is held at L level.

Figure 12:
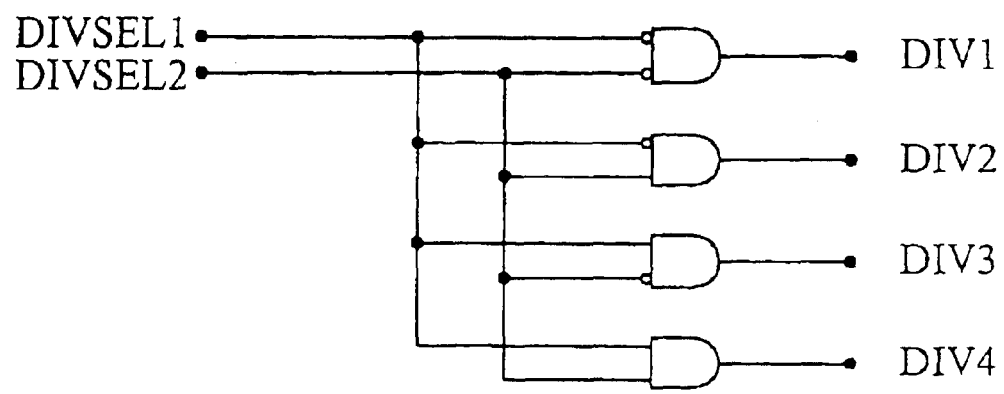
FIG. 12 is a circuit diagram of a principal portion (division timing signal generator circuit) of the third embodiment.
Figure 28:
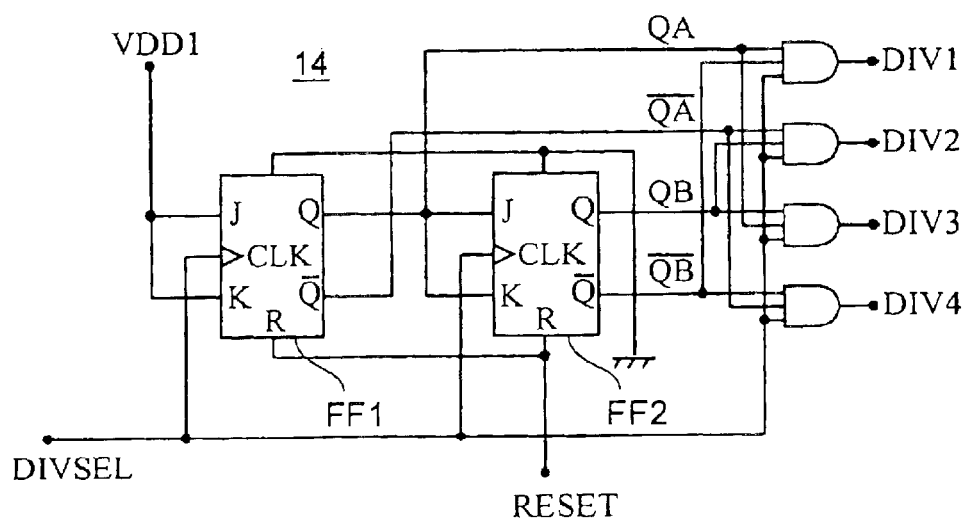
FIG. 28 is a circuit diagram of a principal portion (division timing signal generator circuit) of the fourth embodiment.

The division timing signal generator circuit 14 may be configured as shown in FIG. 12. Here, however, the division timing signal generator circuit 14 is configured, as shown in FIG. 28, so as to count pulses of one external timing signal DIVSEL and output the count. That is, for example as shown in FIG. 28, the division timing signal generator circuit 14 is configured as a counter composed of two flip-flops FF1 and FF2 and a plurality of (for example, four) logic gate circuits G1 to G4.

Specifically, the JK flip-flop FF1 receives a supply voltage VDD1, which is at H level, at its input terminals J and K, receives the external signal DIVSEL at its clock input terminal CL, and receives the reset signal RESET at its reset input terminal R. The flip-flop FF1 outputs a signal QA at the output terminal Q thereof, and outputs a signal $\overline{QA}$ at the output terminal $\overline{Q}$. The JK flip-flop FF2 receives the signal QA at its input terminals J and K, receives the external signal DIVSEL at its clock input terminal CL, and receives the reset signal RESET at its reset input terminal R. The flip-flop FF2 outputs a signal QB at its output terminal Q, and outputs a signal $\overline{QB}$ at its output terminal $\overline{Q}$. The logic gate circuit G1 performs AND operation on the external signal DIVSEL, the signal QA, and the signal $\overline{QB}$, and outputs the division timing signal DIV1. The logic gate circuit G2 performs AND operation on the external signal DIVSEL, the signal $\overline{QA}$, and the signal QB, and outputs the division timing signal DIV2. The logic gate circuit G3 performs AND operation on the external signal DIVSEL, the signal QA, and the signal QB, and outputs the division timing signal DIV3. The logic gate circuit G4 performs AND operation on the external signal DIVSEL, the signal $\overline{QA}$, and the signal $\overline{QB}$, and outputs the division timing signal DIV4.

Figure 27:
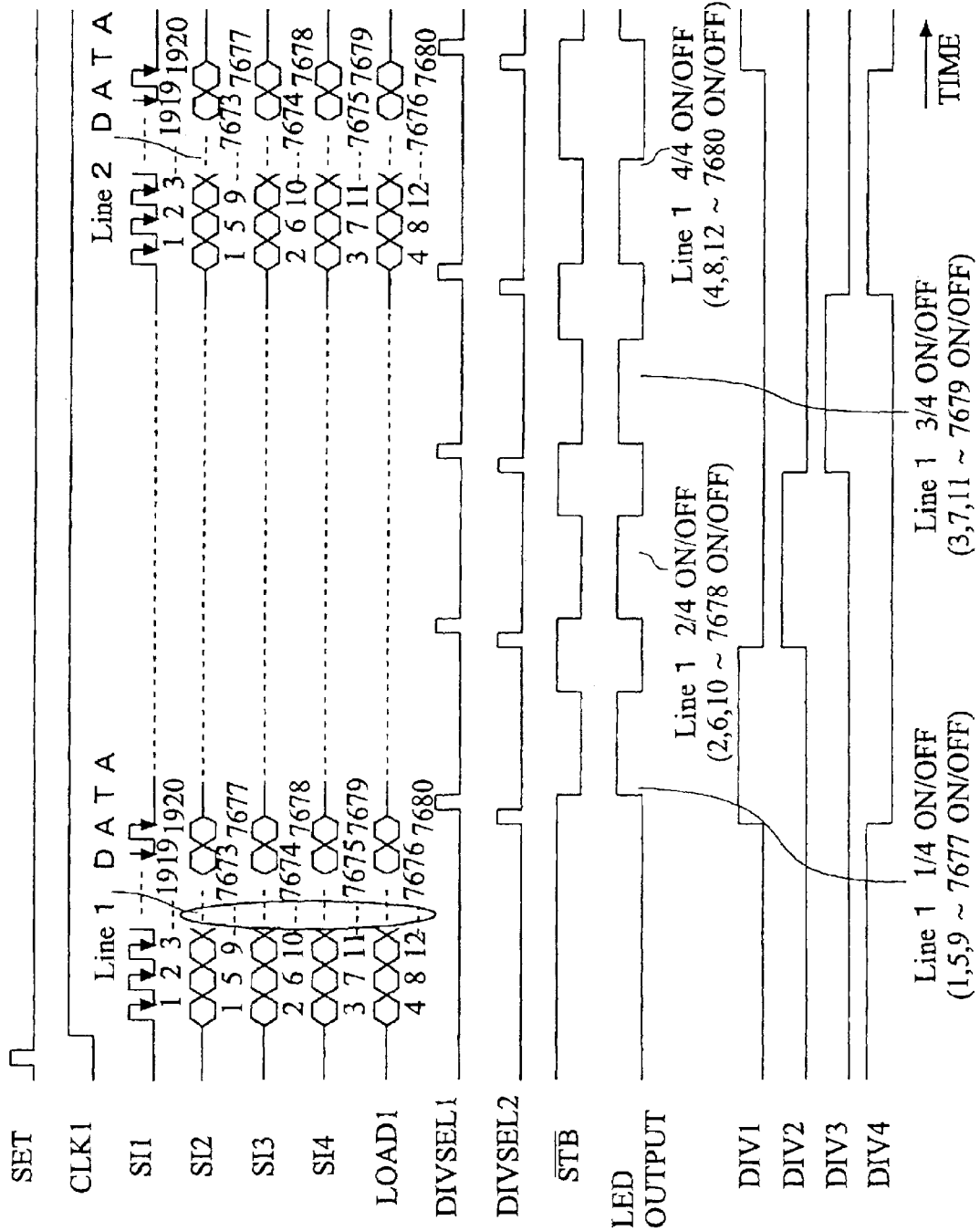
FIG. 27 is a timing chart of the fourth embodiment.

The operation of this embodiment is shown in a timing chart in FIG. 27. As shown in this figure, after data signals corresponding to one line have been taken in through the four inputs SI1 to SI4 with 1,920 clock pulses, it is not possible to take in data signals corresponding to the next line until the driving based on the data signals of the first line is complete. This reduces the processing speed, but instead helps reduce the number of circuit elements provided in the driving IC and thereby make the IC compact and inexpensive. Thus, this embodiment is suitable for optical print heads in which priority is given to miniaturization and cost reduction rather than the processing speed.

In any of the embodiments described above, it is possible to use, as light-emitting devices, not only light-emitting diodes having a PN junction but also light-emitting devices having light-emitting parts with any other structure arranged thereon, such as light-emitting diodes having a PNPN junction (light-emitting thyristors). Moreover, it is possible to use not only light-emitting devices having light-emitting parts arranged in a row but also those having light-emitting parts arranged in a zigzag or in two or more rows.

In the third and fourth embodiments, instead of arranging the driving ICs on one side of the light-emitting devices, it is also possible, as in the first embodiment, to arrange the driving ICs on both sides of the light-emitting devices. In such cases, it is preferable to use light-emitting devices having a resolution twice as high, for example light-emitting devices having a resolution of 2,400 DPI. Moreover, by leaving either the individual terminal section or common terminal section of the driving IC open, or by any other method, it is possible to selectively use its first drive section 2 or second drive section 3 alone.

In the first and second embodiments, it is possible to use, as in the third and fourth embodiments, a multiple-input shift register to which data signals are fed parallel via a plurality of input terminals.

INDUSTRIAL APPLICABILITY

As described above, according to the present invention, it is possible to perform time-division driving while processing data signals in quite the same manner as in conventional static driving. This helps maintain compatibility with static driving. Moreover, by making time-division driving possible, it is possible to reduce the number of driver ICs and the number and density of wire-bonded leads. Moreover, it is possible to connect driving ICs and light-emitting devices together in various combinations. Moreover, it is easy to change the printing speed by modifying input data signals so as to change the effective number of time divisions. Moreover, it is possible to realize a high-resolution optical print head even in a case where the density (resolution) of conductor patterns laid on a substrate is low.

Moreover, it is possible to realize a driver IC that can cope with a plurality of types of light-emitting device with different resolutions. Moreover, it is possible to realize a driver IC and an optical print head that permit high-speed input of data signals. Furthermore, it is possible to reduce the size, reduce the cost, and increase the printing speed of an optical print head.

What is claimed is:

1. A driving IC device for supplying a driving current to a light-emitting device having a plurality of light-emitting parts arranged in a row, the driving IC device comprising n first output terminals each connected to one terminal of m light-emitting parts and a first drive section connected to the first output terminals,
    wherein the first drive section comprises:
        a data signal storage circuit for storing at least n×m data signals fed in a sequential order via r input terminals;
        a data selecting circuit for selecting and extracting, in groups of n, the data signals stored in the data signal storage circuit without changing the sequential order; and
        a drive circuit for outputting drive signals individually to the first output terminals on a basis of the data signals selected by the data selecting circuit.

2. A driving IC device as claimed in claim 1, further comprising m second output terminals each connected to another terminal of n light-emitting parts and a second drive section for selectively connecting one of the second output terminals to a predetermined potential.

3. A driving IC device as claimed in claim 1,
    wherein the data signal storage circuit is composed of a shift register that stores n×m data signals when r data signals are fed in and a latch circuit that stores n×m data signals, and
    the data selecting circuit selects and extracts, in groups of n, the data signals stored in the latch circuit.

4. A driving IC device as claimed in claim 3, further comprising m second output terminals each connected to another terminal of n light-emitting parts and a second drive section for selectively connecting one of the second output terminals to a predetermined potential.

5. A driving IC device as claimed in claim 1,
    wherein the data signal storage circuit is composed of a shift register that stores n×m data signals when r data signals are fed in, and
    the data selecting circuit is composed of a latch circuit that selects and extracts, in groups of n, the data signals stored in the shift register and that stores the n data signals thus extracted.

6. A driving IC device as claimed in claim 5, further comprising m second output terminals each connected to another terminal of n light-emitting parts and a second drive section for selectively connecting one of the second output terminals to a predetermined potential.

7. A driving IC device as claimed in claim 1,
    wherein the first drive section further comprises a correction data storage circuit for storing n×m correction data signals with which to correct the n×m data signals.

8. A driving IC device as claimed in claim 1,
    wherein the driving IC device is for driving a light-emitting device having m or less groups of n light-emitting parts group by group on a time-division basis.

9. A driving IC device as claimed in claim 1, further comprising:
    k×m (where k is an integer equal to or greater than 2) second output terminals each connected to another terminal of n of the light-emitting parts; and
    a second drive section for selectively connecting the second output terminals to a predetermined potential,
    wherein, in the data signal storage circuit, n×m data signals are stored for each of k lines.

10. A driving IC device as claimed in claim 9,
    wherein the number r of input terminals is set to be equal to the number k×m of second output terminals.

11. A driving IC device as claimed in claim 1, further comprising:
    m second output terminals each connected to another terminal of n of the light-emitting parts; and
    a second drive section for selectively connecting the second output terminals to a predetermined potential,
    wherein, when the driving IC device is connected to k of the light-emitting device each having n×(m/k) (where k is a divisor of m) of the light-emitting parts, the driving IC device drives the light-emitting devices in groups of (m/k) on the time-division basis.

12. A driving IC device as claimed in claim 11,
    wherein the number r of input terminals is set to be equal to the number m of second output terminals.

13. A driving IC device for supplying a driving current to a light-emitting device having a plurality of light-emitting parts arranged in a row, the driving IC device comprising n first output terminals each connected to one terminal of m light-emitting parts, m second output terminals each connected to another terminal of n light-emitting parts, a first drive section connected to the first output terminals, a second drive section connected to the second output terminals, and a timing control circuit,
    wherein the first drive section comprises:
        a data signal storage circuit for storing at least n×m data signals fed in a sequential order via r input terminals;
        a division timing generating circuit for generating m division timing signals from a signal fed from the timing control circuit;
        a data selecting circuit for selecting and extracting, in groups of n, the data signals stored in the data signal storage circuit on a basis of the m division timing signals fed from the division timing generating circuit without changing the sequential order; and
        a drive circuit for outputting drive signals individually to the first output terminals on a basis of the data signals selected by the data selecting circuit, and
    the second drive section switches sequentially among the m second output terminals on a basis of the m division timing signals.

14. A driving IC device as claimed in claim 13,
    wherein the number r of input terminals is equal to the number m of second output terminals.

15. A driving IC device as claimed in claim 13,
    wherein the first drive section further comprises a correction data storage circuit for storing n×m correction data signals with which to correct the n×m data signals.

16. A driving IC device as claimed in claim 13,
    wherein the driving IC device is for driving a light-emitting device having m or less groups of n light-emitting parts group by group on a time-division basis.

17. An optical print head comprising a light-emitting device having a plurality of light-emitting parts and a driving IC device for supplying a driving current to the light-emitting parts of the light-emitting device, wherein the light-emitting device comprises n first electrodes each connected to one terminal of a plurality of light-emitting parts, the driving IC device comprises n first output terminals connected individually to the first electrodes of the light-emitting device and a first drive section for outputting the driving current via the first output terminals, and the first drive section comprises a data signal storage circuit for storing at least n×m data signals fed in sequential order via r input terminals, a data selecting circuit for selecting and extracting, in groups of n, the data signals stored in the data signal storage circuit without changing the sequential order, and a drive circuit for outputting drive signals individually to the first output terminals on a basis of the data signals selected by the data selecting circuit.

18. An optical print head as claimed in claim 17, wherein the driving IC device further comprises m second output terminals each connected to another terminal of n light-emitting parts and a second drive section for selectively connecting one of the second output terminals to a predetermined potential.

19. An optical print head as claimed in claim 17,
wherein the data signal storage circuit is composed of a shift register that stores n×m data signals when r data signals are fed in and a latch circuit that stores n×m data signals, and
the data selecting circuit selects and extracts, in groups of n, the data signals stored in the latch circuit.

20. An optical print head as claimed in claim 19, further comprising m second output terminals each connected to another terminal of n light-emitting parts and a second drive section for selectively connecting one of the second output terminals to a predetermined potential.

21. An optical print head as claimed in claim. 17,
wherein the data signal storage circuit is composed of a shift register that stores n×m data signals when r data signals are fed in, and
the data selecting circuit is composed of a latch circuit that selects and extracts, in groups of n, the data signals stored in the shift register and that stores the n data signals thus extracted.

22. An optical print head as claimed in claim 21, further comprising m second output terminals each connected to another terminal of n light-emitting parts and a second drive section for selectively connecting one of the second output terminals to a predetermined potential.

23. An optical print head as claimed in claim 17,
wherein the first drive section further comprises a correction data storage circuit for storing n×m correction data signals with which to correct the n×m data signals.

24. An optical print head as claimed in claim 17,
wherein the driving IC device is for driving the light-emitting device having m or less groups of n light-emitting parts group by group on a time-division basis.

25. An optical print head as claimed in claim 17,
wherein the driving IC device further comprises:
k×m (where k is an integer equal to or greater than 2) second output terminals each connected to another terminal of n of the light-emitting parts; and
a second drive section for selectively connecting the second output terminals to a predetermined potential, and wherein, in the data signal storage circuit, n×m data signals are stored for each of k lines.

26. An optical print head as claimed in claim 25,
wherein the number r of input terminals is set to be equal to the number k×m of second output terminals.

27. An optical print head as claimed in claim 17,
wherein there are provided k of the light-emitting device each having n×(m/k) (where k is a divisor of m) of the light-emitting parts,
wherein the drive IC device further comprises:
m second output terminals each connected to another terminal of n of the light-emitting parts; and
a second drive section for selectively connecting the second output terminals to a predetermined potential, and
wherein the light-emitting devices are driven in groups of (m/k) on a time-division basis.

28. An optical print head as claimed in claim 27,
wherein the number r of input terminals is set to be equal to the number m of second output terminals.

29. An optical print head comprising a light-emitting device having a plurality of light-emitting parts and a driving IC device for supplying a driving current to the light-emitting parts of the light-emitting device,
wherein the light-emitting device comprises n first electrodes each connected to one terminal of m light-emitting parts and m second electrodes each connected to another terminal of n light-emitting parts,
the driving IC device comprises n first output terminals connected individually to the first electrodes of the light-emitting device, a first drive section for outputting the driving current via the first output terminals, m second output terminals connected individually to the second electrodes of the light-emitting device, a second drive section for keeping one of the second output terminals at a predetermined potential so as to make the light-emitting part connected thereto active, and a timing control circuit for outputting m division timing signals,
the first drive section comprises a data signal storage circuit for storing at least n×m data signals fed in sequentially via r input terminals, a data selecting circuit for selecting and extracting, in groups of n, the data signals stored in the data signal storage circuit on a basis of the m division timing signals fed from the timing control circuit, and a drive circuit for outputting drive signals individually to the first output terminals on a basis of the data signals selected by the data selecting circuit, and
the second drive section switches sequentially among the m second output terminals on a basis of the m division timing signals.

30. An optical print head as claimed in claim 29,
wherein the number r of input terminals is equal to the number m of second output terminals.

31. An optical print head as claimed in claim 29,
wherein the first drive section further comprises a correction data storage circuit for storing n×m correction data signals with which to correct the n×m data signals.

32. An optical print head as claimed in claim 29,
wherein the driving IC device is for driving the light-emitting device having m or less groups of n light-emitting parts group by group on a time-division basis.

* * * * *